(12) United States Patent
Hocevar

(10) Patent No.: US 7,668,248 B2
(45) Date of Patent: Feb. 23, 2010

(54) HIGH-PERFORMANCE LDPC CODING FOR DIGITAL COMMUNICATIONS IN A MULTIPLE-INPUT, MULTIPLE-OUTPUT ENVIRONMENT

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 622 days.

(21) Appl. No.: 11/550,662

(22) Filed: Oct. 18, 2006

(65) Prior Publication Data

US 2007/0086539 A1    Apr. 19, 2007

Related U.S. Application Data

(60) Provisional application No. 60/728,269, filed on Oct. 19, 2005.

(51) Int. Cl.
*H04K 1/10* (2006.01)
*H04L 27/28* (2006.01)

(52) U.S. Cl. .......... 375/260; 375/267; 375/262; 375/340; 375/341; 375/349; 714/758; 714/759; 714/800; 714/801; 714/799

(58) Field of Classification Search ............ 375/260, 375/267, 262, 259, 299, 340, 341, 349; 714/759, 714/758, 800, 801, 752, 799, 804
See application file for complete search history.

(56) References Cited

U.S. PATENT DOCUMENTS

| 7,120,856 B2* | 10/2006 | Zhang et al. ............... 714/801 |
| 7,178,082 B2* | 2/2007 | Yu et al. .................... 714/752 |
| 7,451,374 B2* | 11/2008 | Kim et al. .................. 714/748 |
| 7,581,157 B2* | 8/2009 | Oh et al. .................... 714/781 |
| 2004/0034828 A1 | 2/2004 | Hocevar |
| 2004/0148560 A1 | 7/2004 | Hocevar |
| 2004/0194007 A1 | 9/2004 | Hocevar |
| 2005/0257119 A1 | 11/2005 | Blankenship et al. |
| 2006/0026488 A1* | 2/2006 | Kim et al. .................. 714/758 |
| 2006/0036926 A1 | 2/2006 | Hocevar |
| 2006/0123277 A1 | 6/2006 | Hocevar |

OTHER PUBLICATIONS

Winters, "On the Capacity of Radio Communication Systems with Diversity in a Rayleigh Fading Environment", J. Selected Areas Comm., vol. SAC-5, No. 5 (IEEE, Jun. 1987), pp. 871-878.

Winters, "The Impact of Antenna Diversity on the Capacity of Wireless Communication Systems", Trans. Comm., vol. 42, No. 2/3/4 (IEEE, Feb./Mar./Apr. 1994), pp. 1740-1751.

(Continued)

*Primary Examiner*—Phuong Phu
(74) *Attorney, Agent, or Firm*—Steven A. Shaw; W. James Brady; Frederick J. Telecky, Jr.

(57) ABSTRACT

Transceiver circuitry for use in a multiple-input, multiple-output (MIMO), orthogonal frequency-division multiplexing (OFDM), communications environment, is disclosed. Error correction coding according to a fixed-block size code, such as low density parity check (LDPC) coding, is implemented. A specific LDPC code with excellent error rate performance is disclosed.

10 Claims, 14 Drawing Sheets

H1R

| 57 | | | 50 | | 11 | | 50 | | 79 | | 1 | 0 | | | | | | | | | | |
| 3 | | 28 | 0 | | | | 55 | 7 | | | | 0 | 0 | | | | | | | | | |
| 30 | | | 24 | 37 | | | 56 | 14 | | | | | 0 | 0 | | | | | | | | |
| 62 | 53 | | 53 | | | 3 | 35 | | | | | | | 0 | 0 | | | | | | | |
| 40 | | 20 | 66 | | | 22 | 28 | | | | | | | | 0 | 0 | | | | | | |
| 0 | | | 8 | | 42 | | 50 | | | 8 | | | | | | 0 | 0 | | | | | |
| 69 | 79 | 79 | | | | 56 | | 52 | | | | 0 | | | | | 0 | 0 | | | | |
| 65 | | | | 38 | 57 | | 72 | | | 27 | | | | | | | | | 0 | 0 | | |
| 64 | | | 14 | 52 | | | 30 | | | | 32 | | | | | | | | | 0 | 0 | |
| | 45 | | 70 | 0 | | | 77 | 9 | | | | | | | | | | | | | 0 | 0 |
| 2 | 56 | | 57 | 35 | | | | | 12 | | | | | | | | | | | | 0 | 0 |
| 24 | | 61 | | 60 | | | 27 | 51 | | | 16 | 1 | | | | | | | | | | 0 |

DATA PORTION | PARITY PORTION

OTHER PUBLICATIONS

Gesbert et al., "From Theory to Practice: An Overview of MIMO Space-Time Coded Wireless Systems", J. Selected Areas Comm., vol. 21, No. 3 (IEEE, Apr. 2003), pp. 281-302.

Gallager, Low-Density Parity-Check Codes (MIT Press, 1963).

Mackay et al., "Comparison of Constructions of Irregular Gallager Codes", Trans. Comm., vol. 47, No. 10 (IEEE, Oct. 1999), pp. 1449-1454.

Tanner et al., "A Class of Group-Structured LDPC Codes", ISTCA-2001 Proceedings (Ambleside, England, 2001).

Richardson et al., "Efficient Encoding of Low-Density Parity-Check Codes", Trans. on Information Theory (vol. 47, No. 2 (IEEE, Feb. 2001), pp. 638-656.

Kang et al., "Flexible Construction of Irregular Partitioned Permutation LDPC Codes with Low Error Floors", Communication Letters, vol. 9, No. 6 (IEEE, Jun. 2005), pp. 534-536.

Zhang et al., "VLSI Implementation-Oriented (3,k)-Regular Low-Density Parity-Check Codes", IEEE Workshop on Signal Processing Systems (Sep. 2001), pp. 25-36.

\* cited by examiner

| 57 |    |    |    | 50 |    | 11 |    | 50 |    |    |    |    |    |    |    |    |    |    |    |    |    |    |    |
|----|----|----|----|----|----|----|----|----|----|----|----|----|----|----|----|----|----|----|----|----|----|----|----|
| 3  |    | 28 |    | 0  |    |    |    | 55 | 7  |    |    |    |    |    |    |    |    |    |    |    |    |    |    |
| 30 | 53 |    | 20 | 24 | 37 |    |    | 56 | 14 |    | 0  |    |    |    |    |    |    |    |    |    |    |    |    |
| 62 |    |    |    | 53 |    |    | 3  | 35 |    |    | 1  | 0  |    |    |    |    |    |    |    |    |    |    |    |
| 40 |    |    |    | 66 |    |    | 22 | 28 |    | 79 |    | 0  | 0  |    |    |    |    |    |    |    |    |    |    |
| 0  | 79 |    |    | 8  |    | 42 |    | 50 |    |    |    |    | 0  | 0  |    |    |    |    |    |    |    |    |    |
| 69 |    | 79 |    |    | 57 | 56 |    | 52 |    |    |    |    |    | 0  | 0  |    |    |    |    |    |    |    |    |
| 65 |    |    |    | 38 | 52 |    |    | 72 |    | 27 | 8  |    |    |    | 0  | 0  |    |    |    |    |    |    |    |
| 64 | 45 |    | 70 | 14 |    |    |    | 30 | 9  |    |    |    |    |    |    | 0  | 0  |    |    |    |    |    |    |
|    | 56 |    | 57 | 0  |    |    |    | 77 |    |    | 32 |    |    |    |    |    | 0  | 0  |    |    |    |    |    |
| 2  |    |    |    | 35 |    |    | 27 | 51 |    | 12 |    | 0  |    |    |    |    |    | 0  | 0  |    |    |    |    |
| 24 |    | 61 |    | 60 |    |    |    |    |    |    | 16 | 1  |    |    |    |    |    |    | 0  | 0  |    |    |    |

DATA PORTION — PARITY PORTION

FIG. 10

HIGH-PERFORMANCE LDPC CODING FOR DIGITAL COMMUNICATIONS IN A MULTIPLE-INPUT, MULTIPLE-OUTPUT ENVIRONMENT

CROSS-REFERENCE TO RELATED APPLICATIONS

This application claims priority, under 35 U.S.C. §119(e), of Provisional Application No. 60/728,269, filed Oct. 19, 2005, which is incorporated herein by this reference.

STATEMENT REGARDING FEDERALLY SPONSORED RESEARCH OR DEVELOPMENT

Not applicable.

BACKGROUND OF THE INVENTION

This invention is in the field of communications, and is more specifically directed to the encoding and decoding of digital information in such communications.

High-speed data communication services, for example in providing high-speed Internet access, have become a widespread utility for many businesses, schools, and homes. In its current stage of development, this access is provided by an array of technologies. Recent advances in wireless communications technology have enabled localized wireless network connectivity according to the IEEE 802.11 standard to become popular for connecting computer workstations and portable computers to a local area network (LAN), and typically through the LAN to the Internet. Broadband wireless data communication technologies, for example those technologies referred to as "WiMAX" and "WiBro", and those technologies according to the IEEE 802.16d/e standards, have also been developed to provide wireless DSL-like connectivity in the Metro Area Network (MAN) and Wide Area Network (WAN) context.

Multiple-input-multiple-output (MIMO) communication techniques have recently attracted attention, especially in the wireless LAN context. In a general sense, MIMO communications are realized by providing multiple signal paths (i.e., RF data path, or "chain", and antenna) both at a transmitter and at a receiver. In this manner, the transmitted information is either redundantly or independently transmitted over multiple spatial streams between a transmitter antenna and a receiver antenna. The spatial diversity provided by the MIMO approach provides either improved data rate or improved bit error rate in the signal, after combining of the multiple spatial streams at the receiver. These improvements are attractive in any wireless communications context, including wireless LAN (or MAN or WAN) technology, and wireless telephony. An overview of MIMO technology is provided in Gesbert et al., "From Theory to Practice: An Overview of MIMO Space-Time Coded Wireless Systems", *Journal on Selected Areas in Communications*, Vol. 21, No. 3 (IEEE, April 2003), pp. 281-302.

In the wireless LAN context, MIMO communication technology is being investigated for use in conjunction with orthogonal frequency-division multiplexing (OFDM) techniques. As known in the art, OFDM refers to a broadband communications approach in which modulated signals are transmitted over multiple narrow-bandwidth (e.g., 20 kHz) channels. Standardization efforts for use of MIMO OFDM wireless LAN communications have been ongoing in the industry, specifically with reference to the IEEE 802.11n standard. It is contemplated that wireless LAN communications under the eventual 802.11n standard will be able to reach 250 Mbit/second data rates, at distances of up to 50 meters.

A problem that is common to all data communications technologies, including of course MIMO OFDM communications, is the corruption of data by noise. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol as received differs from the data bit or symbol as transmitted. This likelihood of a data error is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Error detection and correction techniques are typically implemented by the technique of redundant coding. In general, redundant coding inserts data bits into the transmitted data stream that do not add any additional information, but that indicate, on decoding, whether an error is present in the received data stream. More complex codes provide the ability to deduce the true transmitted data from a received data stream even if errors are present.

Many types of redundant codes that provide error correction have been developed. One type of code simply repeats the transmission, for example by sending the payload followed by two repetitions of the payload, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood exists that two of three bits are in error, resulting in an erroneous majority vote despite the useful data rate having been reduced to one-third. More efficient approaches, such as Hamming codes, have been developed toward the goal of reducing the error rate while maximizing the data rate.

The well-known Shannon limit provides a theoretical bound on the optimization of decoder error as a function of data rate. The Shannon limit provides a metric against which codes can be compared, both in the absolute and relative to one another. Since the time of the Shannon proof, modem data correction codes have been developed to more closely approach the theoretical limit. An important class of these conventional codes includes "turbo" codes, which encode the data stream by applying two convolutional encoders. One of these convolutional encoders encodes the datastream as given, while the other encodes a pseudo-randomly interleaved version of the data stream. The results from the two encoders are interwoven to produce the encoded data stream.

Another class of known redundant codes are the Low Density Parity Check (LDPC) codes. The fundamental paper describing these codes is Gallager, *Low-Density Parity-Check Codes*, (MIT Press, 1963), monograph available at http://www.inference.phy.cam.ac.uk/mackay/gallager/papers/. In these codes, a sparse matrix H defines the code, with the encodings c of the payload data satisfying:

$$Hc=0 \tag{1}$$

over Galois field GF(2). Each encoding c consists of the source message $c_i$ combined with the corresponding parity check bits $c_p$ for that source message $c_i$. The encodings c are transmitted, with the receiving network element receiving a signal vector r=c+n, n being the noise added by the channel. Because the decoder at the receiver also knows matrix H, it can compute a vector z=Hr. However, because r=c+n, and because Hc=0:

$$z=Hr=Hc+Hn=Hn \qquad (2)$$

The decoding process thus involves finding the most sparse vector x that satisfies:

$$Hx=z \qquad (3)$$

over GF(2). This vector x becomes the best guess for noise vector n, which can be subtracted from the received signal vector r to recover encodings c, from which the original source message $c_i$ is recoverable.

There are many known implementations of LDPC codes. Some of these LDPC codes have been described as providing code performance that approaches the Shannon limit, as described in MacKay et al., "Comparison of Constructions of Irregular Gallager Codes", *Trans. Comm.*, Vol. 47, No. 10 (IEEE, October 1999), pp. 1449-54, and in Tanner et al., "A Class of Group-Structured LDPC Codes", *ISTCA*-2001 *Proc.* (Ambleside, England, 2001).

In theory, the encoding of data words according to an LDPC code is straightforward. Given enough memory or small enough data words, one can store all possible code words in a lookup table, and look up the code word in the table according to the data word to be transmitted. But modern data words to be encoded are on the order of 1 kbits and larger, rendering lookup tables prohibitively large and cumbersome. Accordingly, algorithms have been developed that derive codewords, in real time, from the data words to be transmitted. A straightforward approach for generating a codeword is to consider the n-bit codeword vector c in its systematic form, having a data or information portion $c_i$ and an m-bit parity portion $c_p$ such that $c=(c_i|c_p)$. Similarly, parity matrix H is placed into a systematic form $H_{sys}$, preferably in a lower triangular form for the m parity bits. In this conventional encoder, the information portion $c_i$ is filled with n-m information bits, and the m parity bits are derived by back-substitution with the systematic parity matrix $H_{sys}$. This approach is described in Richardson and Urbanke, "Efficient Encoding of Low-Density Parity-Check Codes", *IEEE Trans. on Information Theory*, Vol. 47, No. 2 (February 2001), pp. 638-656. This article indicates that, through matrix manipulation, the encoding of LDPC codewords can be accomplished in a number of operations that approaches a linear relationship with the size n of the codewords. However, the computational efficiency in this and other conventional LDPC encoding techniques does not necessarily translate into an efficient encoder hardware architecture. Specifically, these and other conventional encoder architectures are inefficient because they typically involve the storing of inverse matrices, by way of which the parity check of equation (1), or a corollary, is solved in the encoding operation.

By way of further background, copending patent application Ser. No. 10/329,597, filed Dec. 26, 2002, now published as U.S. Patent Application Publication No. US 2004/0034828, and copending patent application Ser. No. 10/806,879, filed Mar. 23, 2004, and now published as U.S. Patent Application Publication No. US 2004/0194007 A1, both commonly assigned herewith and incorporated herein by this reference, describe a family of structured irregular LDPC codes, and decoding architectures for those codes. The quasi-cyclic structure of this family of LDPC codes can also provide efficiencies in the hardware implementation of the encoder, as described in copending patent application Ser. No. 10/724,280, filed Nov. 28, 2003, now published as U.S. Patent Application Publication No. US 2004/0148560 A1, commonly assigned herewith and incorporated herein by this reference. The encoder and encoding method that are described in U.S. Patent Application Publication No. US 2004/0148560 A1 follow a generalized approach, and are capable of handling such complications as row rank deficiency.

By way of still further background, copending patent application Ser. No. 11/201,391, filed Aug. 10, 2005 and published as U.S. Patent Application Publication No. US 2006/0036926, commonly assigned herewith and incorporated herein by this reference, describes constraints on this family of structured irregular LDPC codes that enable recursive, and efficient, encoding of communications.

By way of still further background, copending patent application Ser. No. 11/284,929, filed Nov. 22, 2005 and published as U.S. Patent Application Publication No. US 2006/0123277 A1, commonly assigned herewith and incorporated herein by this reference, describes the shortening and puncturing of systematic codewords, and more specifically describes the selection of the number of shortened bits and the number of punctured bits from a given codeword length and code rate, for encoding according to a different selected codeword length. The approach described in this U.S. Patent Application Publication No. US 2006/0123277 A1 is believed to be particularly useful in connection with broadband wireless MAN communications according to the IEEE 802.16 standard.

By way of still further background, it is known to restructure a codeword arrangement in response to a comparison of the fraction of information bits that are to be shortened to the fraction of parity bits that are to be punctured.

As fundamental in the art of coded communications, the codeword length greatly affects the efficiency and performance of the communications system. As such, it is desirable to optimize communications by wisely selecting these code parameters. However, in the context of MIMO OFDM communications, many factors in the particular system implementation and operation are present that ought to be taken into account in selecting the optimum codeword length. These factors include the number of transmit antennae (and RF chains), the number of receive antennae (and RF chains), the number of OFDM subchannels, packet lengths, whether space-time block coding ("STBC") will be used to transmit a single spatial stream across multiple antennae, the modulation scheme applied to individual OFDM subchannels (e.g., 16-QAM, 64-QAM), the desired code rate, whether a short guard interval option is used, and the like.

Convolutional error correcting codes can be readily and flexibly adapted to a wide range of codeword lengths and code rates. It is desirable to obtain the important benefits provided by LDPC codes; however, LDPC codes operate on fixed block sizes, and as such are not easily adapted to varying selections of codeword length and code rate. As discussed above, and as described in the above-incorporated U.S. Patent Application Publication No. US 2006/0123277 A1, it is also desirable to have a minimum number of codeword lengths and code rates in modern LDPC transceivers, so that the memory and computational requirements can be kept modest.

By way of further background, copending patent application Ser. No. 11/465,020, filed Aug. 16, 2006, commonly assigned herewith and incorporated herein by this reference, describes transceiver circuitry for use in a multiple-input, multiple-output (MIMO), orthogonal frequency-division multiplexing (OFDM), communications environment. The codeword length and codeword arrangement for LDPC coding in that environment are selected by determining a minimum number of OFDM symbol periods required for a payload size, and the number of available information bits in those symbol periods. A rule-based approach is used to select the codeword length, and the number of codewords required to send the packet. Shortening is then applied to the code, followed by determining whether puncturing or repeating of bits is necessary to efficiently use the available OFDM symbols.

Once the structure of the LDPC code is determined, whether through use of the methods described in the above-incorporated copending application Ser. No. 11/465,020 or otherwise, one must still select the particular code to be used that fits that structure. The performance of error correcting codes, including LDPC codes, is typically measured by reference to bit error rate over a range of signal-to-noise ratio, usually with the noise characterized as AWGN (additive white Gaussian noise). It has been observed, in connection with this invention, that the code performance of an ensemble of LDPC codes of the same codeword size and code rate can vary widely, even if the structure of the code is common among the codes.

Techniques for evaluating and selecting candidate codes are known. Kang et al., "Flexible Construction of Irregular Partitioned Permutation LDPC Codes with Low Error Floors", *Communication Letters*, Vol. 9, No. 6 (IEEE, June 2005), pp. 534-36, describes the selection of LDPC codes by avoiding small "stopping sets" in the Tanner graph of LDPC codes. In this context, a "stopping set" is a set of input nodes whose associated check sum nodes (or "neighbors") are each connected to the input nodes in this set by at least two arcs. "Cycles" in the Tanner graph of a code are sequences of connections among nodes that return to the starting node without repeating an edge. It is known that the existence of small "stopping sets", or the existence of small "cycles", in the Tanner graph of a given code are harmful to the error floor performance of that code. The Kang et al. letter describes an approach to selecting LDPC codes, by selecting codes that do not have closed paths below a threshold length (e.g., no closed paths of length four), and that have relatively low numbers of cycles of shorter lengths above that threshold. Zhang et al., "VLSI Implementation-Oriented (3,k)-Regular Low-Density Parity-Check Codes", *IEEE Workshop on Signal Processing Systems* (September 2001), pp. 25-36, describes a somewhat similar approach, referring to a "girth average", in which the length of the shortest cycle passing through each node is averaged over the total number of nodes for the code; this girth average is determined over an ensemble of codes to select candidate codes, which are then analyzed for their simulated error rates.

FIG. 8 illustrates a part of a Tanner graph for a belief propagation code, of which LDPC codes constitute a subset. In the example of FIG. 8, four input nodes N1 through N4 and four sums S1 through S4 are shown. Many more input nodes and sums may, of course, be present, as suggested in FIG. 8. In this example, nodes N1 and N2 each contribute to sum S1 and also to sum S2. Node N1 also contributes to sum S3, node N2 also contributes to sum S4, node N3 contributes to sum S2, and so on. FIG. 8 illustrates an example of a closed path, or cycle, of length four. This closed path can be seen by following the arrowed connectors shown in FIG. 8, in sequence. The path from node N1 to sum S1 is a first leg, followed by the path from sum S1 to node N2, then from node N2 to sum S2, and back from sum S2 to node N1. This closed path is a "cycle", because the sequence ends at the same node at which it started (i.e., node N1), and no path was traveled twice. As mentioned above relative to the Kang et al. and Zhang et al. references, it is known in the art that the presence of cycles of short length in the Tanner diagram of an LDPC is typically reflected in poor error rate performance. This poor performance is believed to result from poor diversity in the contributions of distant nodes in sums—the error correcting properties of the code tend to be improved if the contributions to checksums are widely spread among the input nodes. For example, as noted above, LDPC codes having one or more cycles of length four are often excluded from use.

It has been discovered, in connection with this invention, that analysis of cycles in the Tanner graph of LDPC codes does not necessarily result in a determination of the optimum code in an ensemble of codes with the same structure, code rate, and codeword size.

BRIEF SUMMARY OF THE INVENTION

It is therefore an object of this invention to provide a Low Density Parity Check (LDPC) code, and methods of encoding and decoding transmissions using such a code, with excellent error rate performance when applied to a multiple-input, multiple-output (MIMO) network link using orthogonal frequency-division multiplexing (OFDM) communication.

It is a further object of this invention to provide such a code and such methods that can be realized with relatively modest computational and memory requirements, particularly at the decoder.

It is a further object to provide such a code and such methods that enabled layered decoding and a relatively high degree of parallelism in decoding.

Other objects and advantages of this invention will be apparent to those of ordinary skill in the art having reference to the following specification together with its drawings.

The present invention may be implemented into a code that is implemented into coding methods and coding circuits involved in transmitting and receiving digital communications in a network, such as a wireless local area network (LAN) using orthogonal frequency-division multiplexing (OFDM) techniques in a multiple-input, multiple-output (MIMO) environment. The code is specified according to a sparse arrangement of cyclically shifted permutation matrices, with specific shift values for each permutation matrix to provide excellent error rate performance. Column and row re-ordering may be applied as desired to a macro matrix representative of the code, in which each entry of the macro matrix corresponds to a single permutation matrix, without substantially changing the code performance or other attributes.

BRIEF DESCRIPTION OF THE SEVERAL VIEWS OF THE DRAWING

FIG. 9a illustrates a macro matrix for a code rate ½ LDPC code according to a preferred embodiment of the invention, presented in a systematic fashion.

FIG. 9b illustrates the shift values for the permutation matrices in the macro matrix arrangement of FIG. 9a, according to the preferred embodiment of the invention.

FIG. 10 illustrates the macro matrix shift values for an LDPC code, after some amount of row and column reordering, according to a preferred embodiment of the invention.

DETAILED DESCRIPTION OF THE INVENTION

The present invention will be described in connection with its preferred embodiment, namely as implemented into a multiple-input, multiple-output (MIMO) network device and method, operating according to orthogonal frequency-division multiplexing (OFDM) communications, for example in a wireless local area network (LAN) implementation. This example embodiment is described because it is believed that this invention will be especially beneficial in that environment. However, it is contemplated that this invention will also provide important benefits in other coded communications applications, using different modulation schemes, and regardless of the communications medium. Accordingly, it is to be understood that the following description is provided by way of example only, and is not intended to limit the true scope of this invention as claimed.

Figure 1:
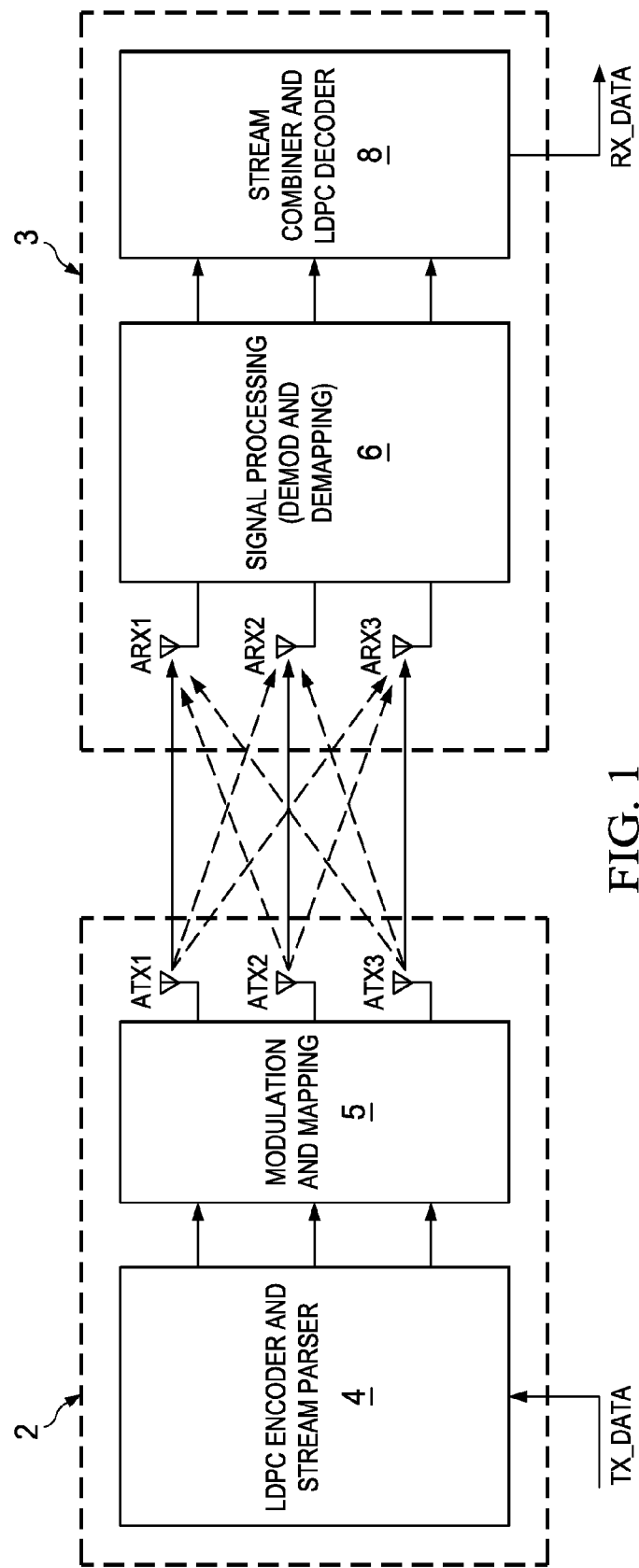
FIG. 1 is an electrical diagram, in block form, of a multiple-input, multiple-output (MIMO) network link, according to the preferred embodiment of the invention.

FIG. 1 functionally illustrates a network link in a MIMO communications system, including transmitter 2 and receiver 3, constructed according to the preferred embodiment of the invention. Typically, as known in the art, each side of the network link will include both a transmitter and a receiver, to support bidirectional communications, and as such the hardware on each side of the link will be constructed as a transceiver. For purposes of clarity in describing MIMO communications for the context of this invention, however, FIG. 1 illustrates only communications in one direction.

Transmitter 2 receives transmit data stream TX_DATA, which corresponds to the data to be transmitted to receiver 3. The source of transmit data stream TX_DATA may be a host computer or other electronic device, which may be coupled to transmitter 2 either directly or via a router, bridge, or other network element. Transmitter 2 includes LDPC encoder and stream parser 4 and modulation and mapping function 5, in this MIMO configuration. LDPC encoder and stream parser 4 encodes transmit data stream TX_DATA according to a fixed block size error correcting code; an example of such a code that is especially well-suited for this embodiment of the invention is a Low Density Parity Check (LDPC) code, as will be described in further detail below. The stream parser function of LDPC encoder and stream parser 4 separates the encoded data stream into signal streams that, according to this preferred embodiment of the invention, will be separately mapped and modulated for transmission from individual ones of three antennae ATX1, ATX2, ATX3, in this example. These separated signals streams are commonly referred to, in the MIMO art, as spatial streams. Typically, in the MIMO wireless LAN context, the spatial parsing of transmit data stream TX_DATA results in the content of the separate spatial streams being distinct and independent from one another, such that each antenna ATX1 through ATX3 is transmitting independent data from the other antennae. As known in the art, this approach greatly improves the data rate as compared with single-input, single-output, communications. Alternatively, the spatial parsing may simply replicate transmit data stream TX_DATA to form spatial streams that redundantly communicate the same payload. For purposes of this description, LDPC encoder and stream parser 4 produces separate independent and distinct encoded spatial data streams, as will be described in further detail below.

Modulation and mapping function 5 includes the appropriate signal processing circuitry and logic to generate time-domain analog signals, one for each of the separated spatial streams produced by LDPC encoder and stream parser 4 to be transmitted over antennae ATX1 through ATX3. In the OFDM MIMO context into which the preferred embodiment of this invention is implemented, and as will be described below, modulation and mapping function 5 will include such functionality, for each data stream, as bit-to-symbol encoding to arrange the code words into complex values for each of multiple sub-channels, space-time block coding, inverse discrete Fourier transform modulation into time-domain signals over each of the sub-channels, and the necessary analog, RF, filtering, and other operations to produce the signal driven over the associated antenna ATX1 through ATX3.

Figure 2A:
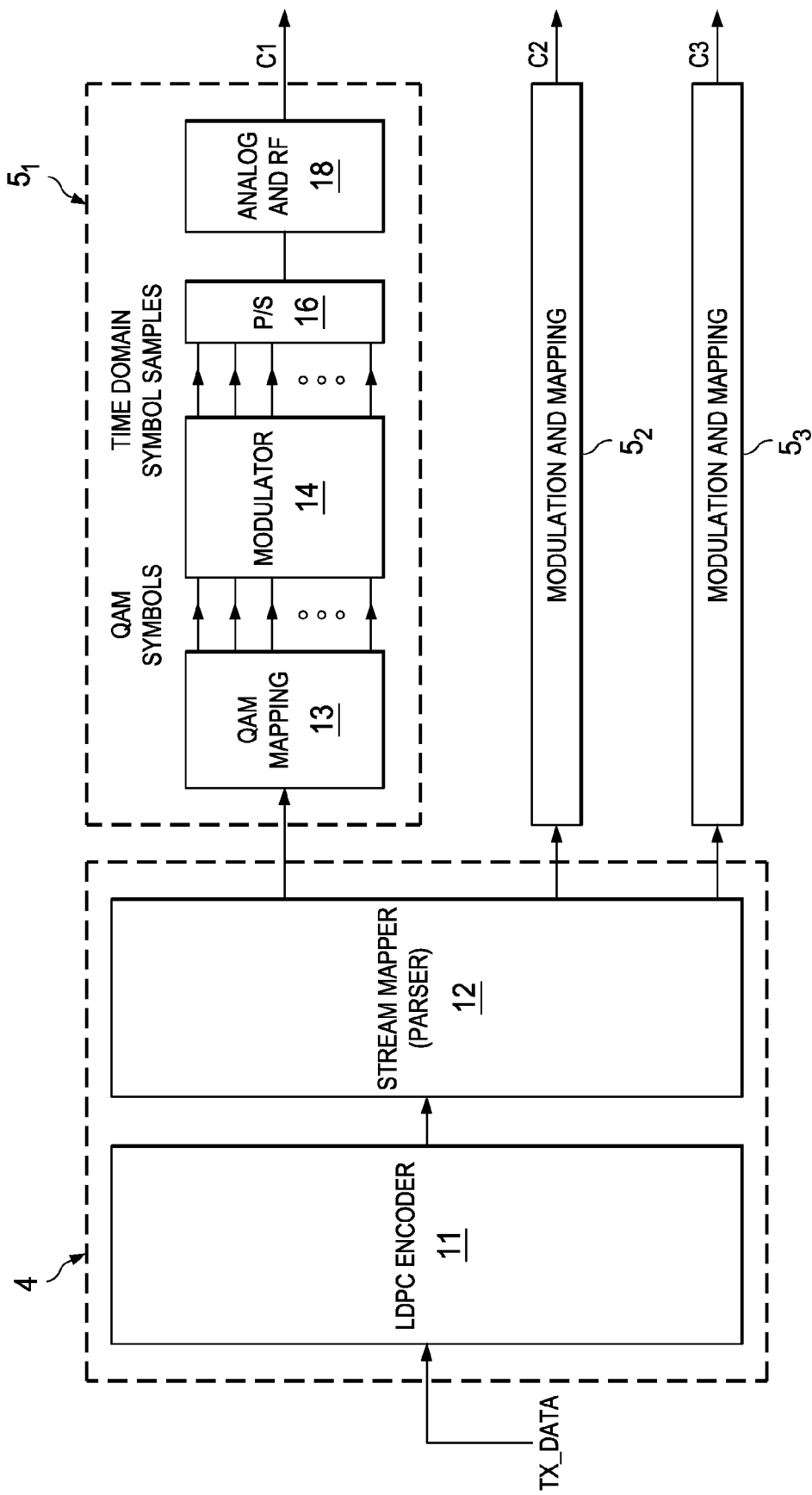
FIG. 2*a* is a functional block diagram of the transmitting side in a MIMO orthogonal frequency-division multiplexing (OFDM) link, according to the preferred embodiment of the invention.

FIG. 2a functionally illustrates transmitter 2 according to the preferred embodiment of the invention. As discussed above, LDPC encoder and stream parser 4 receives input bitstream TX_DATA that is to be transmitted to receiver 3. Typically, input bitstream TX_DATA is a serial stream of binary digits, in the appropriate format as produced by the data source. LDPC encoder 11 within LDPC encoder and stream parser 4 digitally encodes the datastream for error detection and correction purposes, by applying an LDPC code. According to the preferred embodiment of the invention, as will be described below, the selection of codeword length and the arranging of codewords, by way of shortening, puncturing, and repeating, are based on various network parameters and data traffic parameters to optimize the data rate and bit error rate of the transmitted signals. While the selected codeword length and the codeword arrangement may apply to a large number of communications packets, it is contemplated that the preferred embodiment of the invention will operate by frequently selecting the codeword length and arrangement, to account for differences in transmission parameters and in the nature of the packets being sent. Indeed, it is contemplated that the selection of the codeword length and arrangement may be carried out as frequently as for each packet (i.e., responsive to the packet length of each individual packet.).

The particular LDPC code used by encoder function 11, according to this preferred embodiment of the invention, will be described in further detail below. In general, each codeword generated by LDPC encoder 11 includes both payload data bits from input bitstream TX_DATA and also code bits that are selected, based on those payload bits, so that the application of the codeword (payload plus code bits) to the sparse LDPC parity check matrix equals zero for each parity check row.

After encoding by LDPC encoder 11, stream mapper 12 in LDPC encoder and stream parser 4 divides the encoded data stream into blocks, or spatial streams, each sent to one of multiple modulation and mapping channels $5_1$ through $5_3$. Each of modulation and mapping channels $5_1$ through $5_3$ apply a similar sequence of functions to their respective spatial stream. Accordingly, the functional operation of each of channels $5_1$ through $5_3$ will be described relative to one example, specifically modulation and mapping channel $5_1$ associated with antenna ATX1.

Within each instance of modulation and mapping function 5, QAM mapping function 13 groups the incoming bits into symbols that modulate each of a set of carrier frequencies (i.e., subchannels) in the eventual OFDM transmission. According to this embodiment of the invention, QAM mapping function 13 generates complex values for each of symbol, according to a modulation constellation selected for use in this transmission. A popular modulation constellation for MIMO OFDM communications is the well-known quaternary amplitude modulation (QAM) scheme, in which each data value corresponds to a point in the complex plane (i.e., having real and imaginary components). The QAM modulated data stream produced by QAM mapping function 13 is applied to modulator 14, which generates a corresponding time-domain data stream. The particular modulation applied by modulator 14 is preferably a multiple-carrier modulator, as used in OFDM modulation contemplated for certain IEEE 802.11n wireless broadband modes. In the case of multiple-carrier modulation, modulator 14 will apply an inverse Discrete Fourier Transform (IDFT) function to the output of QAM mapping function 13, to associate each complex-valued input symbol stream with one subchannel in the transmission frequency band, and to generate a corresponding number of time domain symbol samples according to the Fourier transform. In any case, to the extent that modulator 14 generates multiple time domain symbol samples, this datastream is converted into a serial stream of samples by parallel-to-serial converter 16. This serial sequence presents symbol values representative of the sum of a number of modulated subchannel carrier frequencies, the modulation indicative of the various data values, and including the appropriate redundant code bits for error correction. Those skilled in the art having reference to this specification will readily recognize that each of functions 11 through 16 may be carried out, and preferably actually are carried out, as digital operations executed by a digital signal processor (DSP).

Analog and RF function 18 then processes and transmits the modulated signal for its associated communications channel. Function 18 applies the appropriate digital filtering operations, such as interpolation to increase sample rate and digital low pass filter for removing image components, for the transmission. The digitally-filtered signal is then converted into the analog domain, and the appropriate analog filtering is then applied to the output analog signal, prior to its transmission. Function 18 then generates the appropriate RF signal based on this modulated signal, and transmits that RF signal over the corresponding antenna ATX1 through ATX3. Similarly, modulation and mapping channels $5_2$, $5_3$ generate modulated multi-carrier OFDM signals for transmission over transmission channels C2, C3, respectively. The particular attributes of each transmission channel C will of course depend upon the type of communications being carried out. In the wireless communications context, the channel will be the particular environment through which the wireless broadband or LAN transmission takes place.

Referring back to FIG. 1, receiver 3 reverses the processes embodied by transmitter 2, to produce receive data stream RX_DATA that is provided to a router, host system, or other destination. Receiver 3 includes signal processing function 6, which receives signals from three antennae ARX1 through ARX3, and which demodulates and demaps these three signals into digital data for application to stream combiner and LDPC decoder function 8. Signal processing function 6 effectively reverses the modulation and encoding processes performed by modulation and mapping function 5, separately and individually for the signals at each of receive antennae ARX1 through ARX3, as will now be described relative to FIG. 2b.

Similarly as described above relative to FIG. 2a, multiple signal processing functions $6_1$ through $6_3$ similarly process the received signal over associated communication channels C1 through C3, respectively; as such, the functional arrangement of signal processing functions $6_1$ through $6_3$ will be described relative to signal processing function $6_3$ by way of example. For the detailed example of signal processing function $6_3$, the received signal at antenna ARX3 is applied to analog and RF function 21, which applies the appropriate analog filtering, analog-to-digital conversion, and digital filtering to the received signals. Serial-to-parallel converter 23 converts the filtered datastream (i.e., now in the digital domain) into a number of samples that are applied to demodulator function 24. In this multiple subchannel OFDM system, demodulator function 24 applies a Discrete Fourier Transform (DFT) to recover the modulating symbols at each of the subchannel frequencies, reversing the IDFT performed by modulator 14 in transmitting transceiver 10. The output of demodulator 24 is thus a frequency domain representation of a block of transmitted symbols, multiplied by the frequency-domain response of the effective transmission channel.

MIMO detection function 25 then operates in the conventional manner for MIMO receivers, combining signals received over all of the communications channels C1 through C3 to recover the transmitted signal for an associated spatial signal stream. As known in the art, this MIMO detection performed over all received signals provides the benefits of spatial diversity in the communications data rate, for a given bit error rate, attained by MIMO communications including space-time block coding if used, as compared with single antenna, non-spatially-diverse, technologies. After recovery of the spatial stream for its channel, symbol-to-bit decoder function 26 generates and applies soft estimates of the recovered symbols to stream combiner 27, which concatenates the similarly demodulated and demapped spatial signal streams over all of the channels (C1 through C3 in this example), to produce a single encoded datastream.

LDPC decoder function 28 reverses the LDPC error correction encoding that was applied by LDPC encoder 11 in the transmission of the signal, to recover an output bitstream RX_DATA, which is forwarded to the host workstation or other recipient. As mentioned above, the selection of codeword length and the arranging of codewords, by way of shortening, puncturing, and repeating, are based on various network parameters and data traffic parameters to optimize the data rate and bit error rate of the transmitted signals, and were applied by LDPC encoder 11. Especially considering that the codeword length and arrangement may be derived and modified frequently, perhaps as frequently as for each packet, LDPC decoder function 28 must similarly apply the selected codeword length and arrangement. According to the preferred embodiment of the invention, information regarding the selected codeword length and arrangement is not directly, in and of itself, communicated to receiver 3; rather, receiver 3 preferably itself derives the selected codeword length and arrangement, using the same parameters input to transmitter 2 and using the same or very similar algorithm for making the selection.

Figure 3:
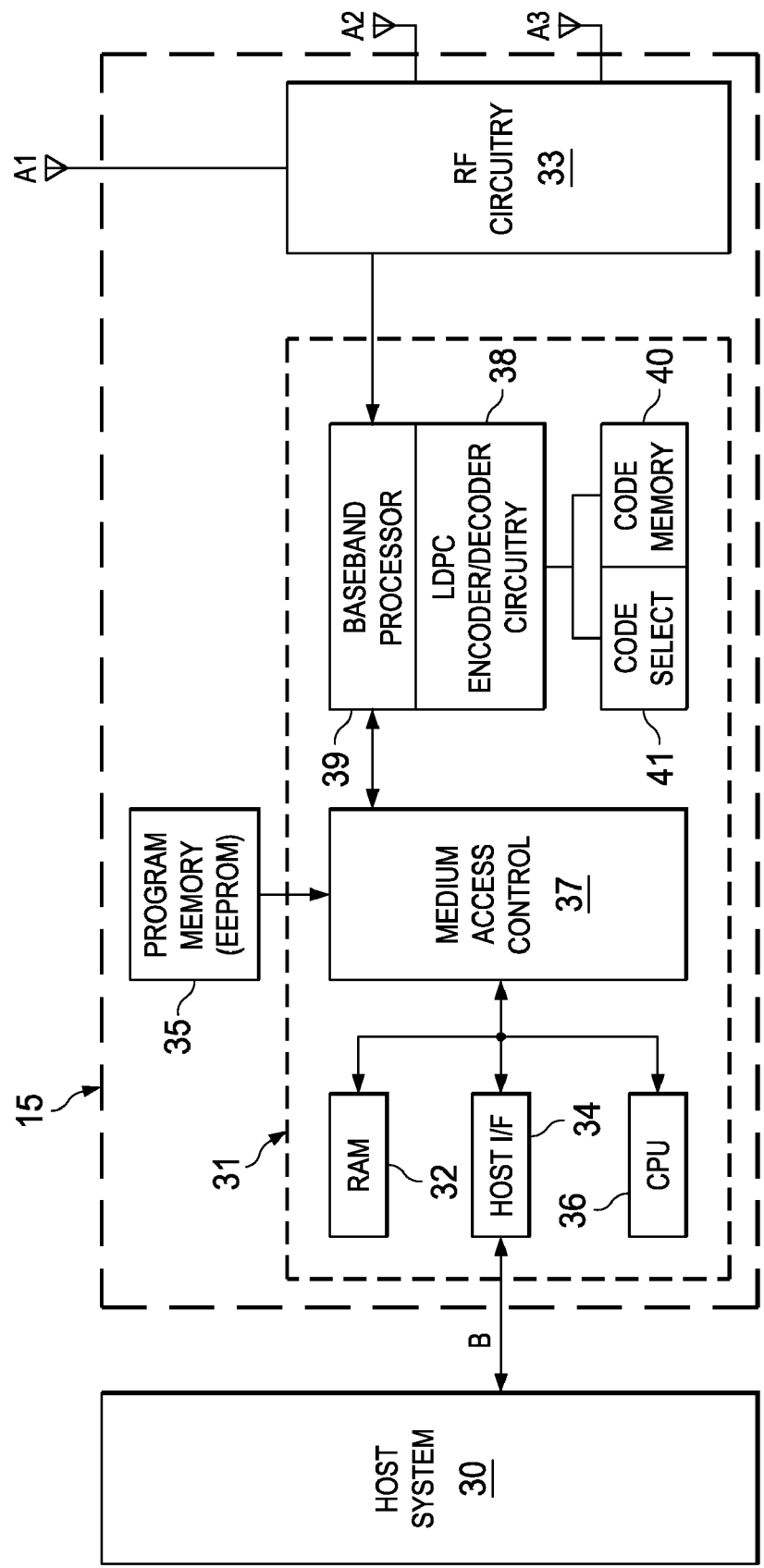
FIG. 3 is an electrical diagram, in block form, of a transceiver constructed according to the preferred embodiments of the invention.

As mentioned above, transmitter 2 and receiver 3 will generally be realized within a single hardware system, i.e., a transceiver, so that time-division multiplexed (or frequency-division multiplexed) MIMO OFDM communications can be carried out. FIG. 3 illustrates an exemplary construction of transceiver 15, in the form of a wireless broadband network adapter. Of course, it is contemplated that other architectures and approaches to realizing transceiver 15 may also be used, as will be apparent to those skilled in the art having reference to this specification.

In FIG. 3, transceiver 15 is coupled to host system 30 by way of a corresponding bus B. Host system 30 corresponds to a personal computer, a laptop computer, or any sort of computing device capable of wireless broadband communications, in the context of a wireless wide area network (WAN) or "metro" area network ("MAN"); of course, the particulars of host system 30 will vary with the particular application. In the example of FIG. 3, transceiver 15 may correspond to a built-in broadband wireless adapter that is physically realized within its corresponding host system 30, to an adapter card installable within host system 30, or to an external card or adapter coupled to host computer 30. The particular protocol and physical arrangement of bus B will, of course, depend upon the form factor and specific realization of transceiver 15. Examples of suitable buses for bus B include PCI, MiniPCI, USB, CardBus, and the like.

Transceiver 15 in this example includes spread spectrum processor 31, which is bidirectionally coupled to bus B on one side, and to radio frequency (RF) circuitry 33 on its other side. RF circuitry 33, which may be realized by conventional RF circuitry known in the art, performs the analog demodulation, amplification, and filtering of RF signals received over the wireless channel and the analog modulation, amplification, and filtering of RF signals to be transmitted by transceiver 15 over the wireless channel, both via multiple antennae A1 through A3 in this MIMO context. The architecture of spread spectrum processor 31 into which this embodiment of the invention can be implemented follows that of the TNETW1130 single-chip media access controller (MAC) and baseband processor available from Texas Instruments Incorporated, by way of example, and that corresponds to a wireless LAN realization at customer premises equipment. It is contemplated that the architecture of other transceiver installations, including for wireless broadband communications, whether on the network or client side, can follow a similar generic approach, as modified for the particular application location, as known in the art. This exemplary architecture includes embedded central processing unit (CPU) 36, for example realized as a reduced instruction set (RISC) processor, for managing high level control functions within spread-spectrum processor 31. For example, embedded CPU 36 manages host interface 34 to directly support the appropriate physical interface to bus B and host system 30. Local RAM 32 is available to embedded CPU 36 and other functions in spread spectrum processor 31 for code execution and data buffering. Medium access controller (MAC) 37 and baseband processor 39 are also implemented within spread-spectrum processor 31 according to the preferred embodiments of the invention, for generating the appropriate packets for wireless communication, and providing encryption, decryption, and wired equivalent privacy (WEP) functionality. Program memory 35 is provided within transceiver 15, for example in the form of electrically erasable/programmable read-only memory (EEPROM), to store the sequences of operating instructions executable by spread-spectrum processor 31, including the coding and decoding sequences according to the preferred embodiments of the invention, which will be described in further detail below. Also included within transceiver 15, in the form of a wireless adapter, are other typical support circuitry and functions that are not shown, but that are useful in connection with the particular operation of transceiver 20.

Figure 2B:
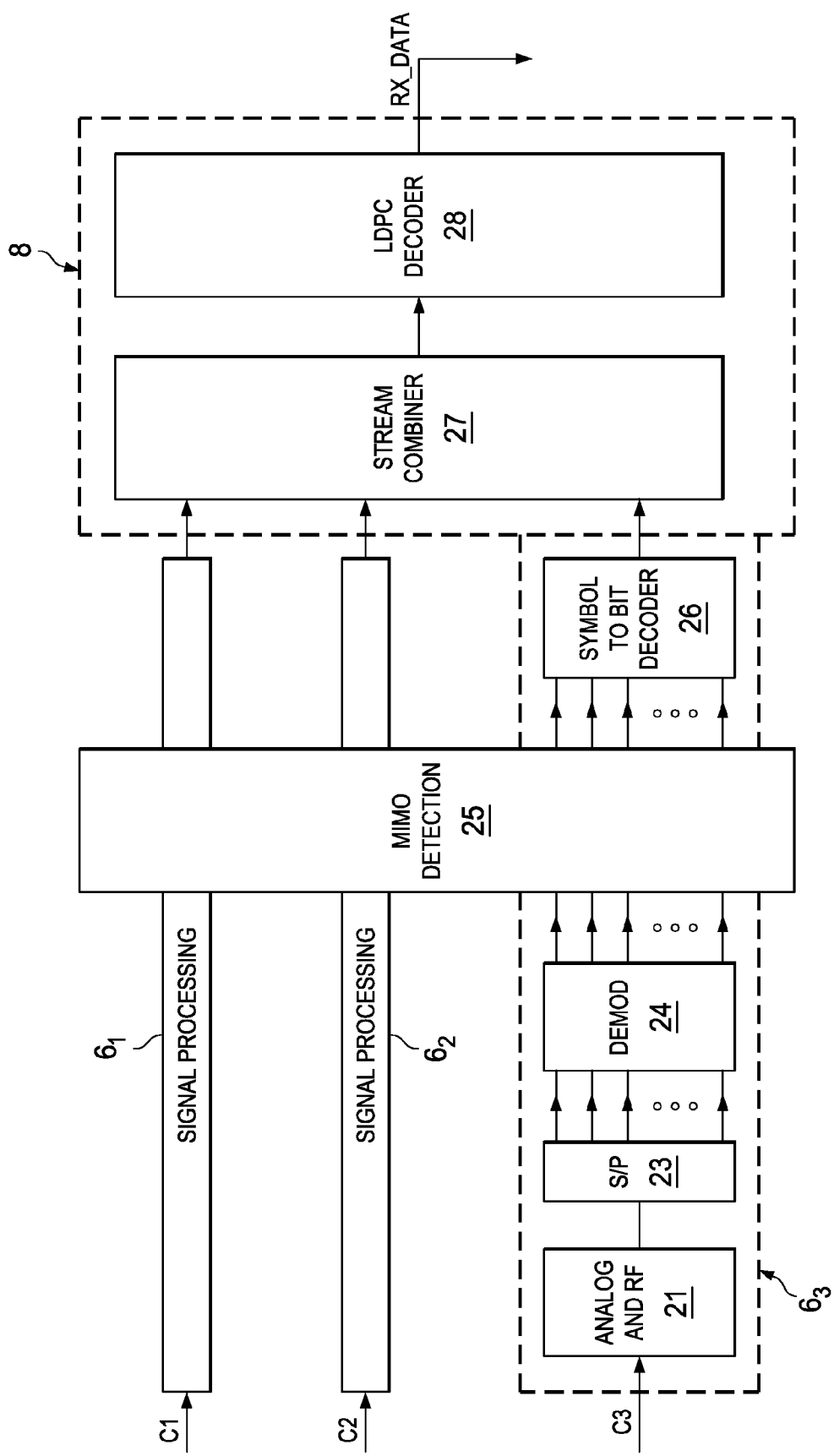
FIG. 2*b* is a functional block diagram of the receiving side in a MIMO OFDM network link, according to the preferred embodiment of the invention.

According to the preferred embodiments of the invention, LDPC encoder and stream parser 4 (FIG. 1), which encodes and divides the incoming bit stream TX_DATA as received on bus B from host system 30, as well as stream combiner and LDPC decoder function 8, which reverses that process, may be realized in various alternative circuits within transceiver 15. For example, on the transmit side, baseband processor 39 may receive input bitstream TX_DATA from host interface 34, and itself separate or divided this bitstream into the multiple data streams for MIMO transmissions after LDPC encoding by LDPC encoder/decoder circuitry 38. Alternatively, CPU 36 may itself, or via host interface 34, divide or separate the incoming bitstream TX_DATA into the multiple transmission channels, after LDPC encoding. Further in the alternative, special purpose logic circuitry (not shown in FIG. 3) may be provided within transceiver 15 to carry out the operations of stream parser 12 and stream combiner 27 (FIGS. 2a and 2b, respectively). It is contemplated that those skilled in the art having reference to this description will be readily able to realize these functions, either as custom logic, program instruction sequences, or the like, within a particular realization of transceiver 15.

According to the preferred embodiments of the invention, LDPC encoding and decoding is embodied in specific custom architecture hardware associated with baseband processor 39, and shown as LDPC encoder/decoder circuitry 38 in FIG. 3. LDPC encoder/decoder circuitry 38 is custom circuitry for performing the coding of transmitted and data packets according to the preferred embodiments of the invention. Alternatively, it is contemplated that baseband processor 39 itself, or other computational devices within transceiver 15, may have sufficient computational capacity and performance to implement the encoding and decoding functions described below in software, specifically by executing a sequence of program instructions. It is contemplated that those skilled in the art having reference to this specification will be readily able to construct such a software approach, for those implementations in which the processing resources are capable of timely performing such encoding. In either case, code memory 40 is provided within transceiver 15, for storing the parameters of the particular codes that are available for use in the encoding and decoding of coded transmissions by transceiver 15.

To the extent that LDPC decoding is also carried out by special purpose logic within LDPC encoder/decoder circuitry 38, examples of architectures for such decoding is described in the above-incorporated copending patent application Ser. No. 10/329,597, filed Dec. 26, 2002, now published as U.S. Patent Publication No. US 2004/0034828, and my copending patent application Ser. No. 10/806,879, filed Mar. 23, 2004, and now published as U.S. Patent Publication No. US 2004/0194007 A1, both commonly assigned herewith and incorporated herein by this reference.

It is contemplated that the multiple functional paths for transmitting and receiving over multiple antennae may be realized by way of a time-sharing or multiplexing of the circuitry shown in FIG. 3, by way of parallel processing, or even by way of multiple realizations of the hardware illustrated in FIG. 3 for the multiple channels. It is contemplated that those skilled in the art having reference to this specification will be readily able to realize this architecture in the MIMO context, without undue experimentation.

It is also contemplated that the selection of code word length and codeword arrangement for the MIMO OFDM symbols as performed according to this preferred embodiment of the invention can be performed by various hardware or software functions and circuits within transceiver 15. For example, FIG. 3 illustrates code select function 41, which illustrates specific logic circuitry within transceiver 15 that determines the appropriate code word length and codeword arrangement, according to the approach described in further detail below. Alternatively, it is contemplated that baseband processor 39 may be able to carry out this selection, for example, periodically or for each packet or group of packets transmitted or received during a communications session. Furthermore, it is also contemplated that the determination of the codeword length and codeword arrangement according to this preferred embodiment of the invention will generally be performed at both sides of the network link, both at the transmitter for packets to be transmitted, and also at the receiver for packets being received.

Referring back to the network link illustrated in FIG. 1, the signals transmitted from each of transmitting antennae ATX1 through ATX3 are received at each of receiving antennae ARX1 through ARX3, considering that these RF signals are effectively omnidirectional. As known in the art for MIMO communications environments, the spatial diversity provided by the multiple channels and antennae substantially increased the data rate that can be achieved for a given bit error rate. In effect, the data is transmitted over a matrix channel H, corresponding to the multiple paths shown in FIG. 1, rather than over a vector channel as in single-input, single-output, communications:

$$r = Hs + n$$

where r is the received signal vector, s is the transmitted signal vector, and n is the vector for noise received at the receivers. For the example of FIG. 3, in which three transmit antennae ATX1 through ATX3 and three receive antennae ARX1 through ARX3 are used:

$$\begin{pmatrix} r_1 \\ r_2 \\ r_3 \end{pmatrix} = \begin{pmatrix} h_{11} & h_{12} & h_{13} \\ h_{21} & h_{22} & h_{23} \\ h_{31} & h_{32} & h_{33} \end{pmatrix} \begin{pmatrix} s_1 \\ s_2 \\ s_3 \end{pmatrix} + \begin{bmatrix} n_1 \\ n_2 \\ n_3 \end{bmatrix}$$

where $r_i$ and $s_i$ are the signals received and transmitted from the ith receive and transmit antennae, respectively, where $h_{jk}$ is the channel between the kth transmit antenna and the jth receive antenna, and where $n_m$ is the noise received at the mth receive antenna. It can be readily derived that the signal-to-noise ratio is increased by a factor min(j, k) for a MIMO system involving j receive antennae and k transmit antennae, for a given bit error rate.

In effect, the transmitted signals are simultaneously propagated over multiple "eigen-modes", which provides spatial multiplexing gain in similar manner as obtained from antenna arrays. From a signal processing standpoint, the received radio signals are processed not only in time, but also in space. The coverage or range, signal fidelity, overall data capacity, and peak data rate can thus be maximized. In the case of MIMO wireless LAN implementations, the MIMO approach effectively exploits multi-path propagation between a given transmit antenna ATXk and a given receive antenna ARXj. For example, the multiple receiver channels collectively enable distinguishing and recovering the signal transmitted from individual ones of transmit antennae ATX1, ATX2, and ATX3.

The fundamentals of MIMO communications, and the improved data rate and bit error rate performance obtainable in MIMO communications, are described in Winters, "On the Capacity of Radio Communication Systems with Diversity in a Rayleigh Fading Environment", *J. Selected Areas in Communications*, Vol. SAC-5, No. 5 (IEEE, June 1987), pp. 871-78; Winters et al., "The Impact of Antenna Diversity on the Capacity of Wireless Communication Systems", *Trans. Communications*, Vol. 42, No. 2/3/4 (IEEE, February/March/April 1994), pp. 1740-51; Gesbert et al., "From Theory to Practice: An Overview of MIMO Space-Time Coded Wireless Systems", *J. Selected Areas in Communications*, Vol. 21, No. 3 (IEEE, April 2003), pp. 281-301; all incorporated herein by this reference.

According to this preferred embodiment of the invention, as mentioned above, the MIMO network link shown in FIG. 1 is communicating signals in an OFDM format. As such, each of the transmitted signals $s_1$ through $s_3$ is an OFDM signal, including modulated signals over multiple subchannels within the bandwidth. And, in conventional fashion for OFDM communication, the signal is arranged into a payload of a sequence of one or more OFDM symbols, each OFDM symbol occupying a symbol period in the time domain.

Figure 4:
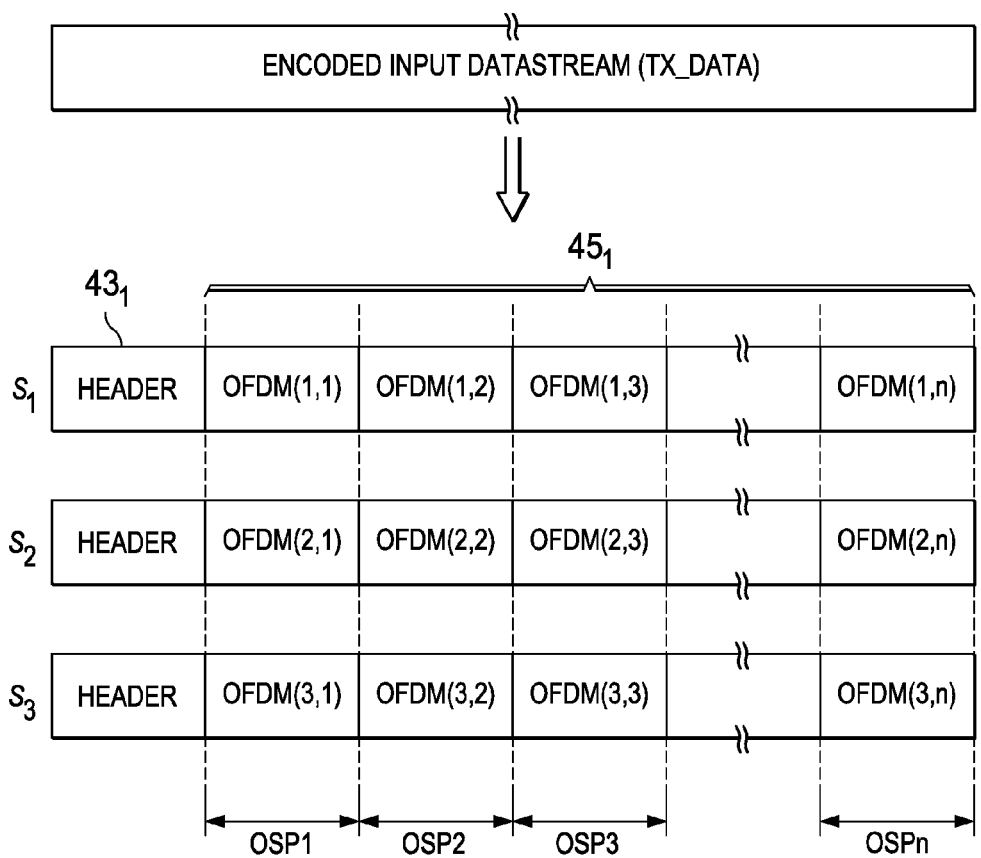
FIG. 4 is a diagram illustrating a sequence of symbol periods in the MIMO OFDM network link, according to the preferred embodiment of the invention.

As evident from FIG. 1, however, this MIMO OFDM signal must be constructed from the input datastream TX_DATA in some fashion. In particular, the input datastream TX_DATA must be divided into multiple signal streams, for example one for each transmit antenna ATX1 through ATX3 (or, in the case of space-time block coding, or STBC, one for each pair of transmit antennae). Referring back to FIG. 1, this dividing of input datastream TX_DATA into multiple spatial signal streams is performed by LDPC encoder and stream parser 4, as it presents multiple data streams to modulation and mapping function 5. FIG. 4 illustrates the result of this operation by LDPC encoder and stream parser 4, with the encoded version of input datastream TX_DATA processed into three spatial signal streams $s_1$ through $s_3$, for modulation and transmitting over three transmit antennae ATX1 through ATX3. Each signal stream s includes a header portion (header $43_1$ for signal stream $s_1$) and a payload portion (payload $45_1$ for signal stream $s_1$). Each payload portion includes multiple OFDM symbols; for example, payload portion $45_1$ is shown as a sequence of OFDM symbols OFDM(1,1) through OFDM(1,n), which are transmitted during OFDM symbol periods OSP1 through OSPn, respectively. Signal streams $s_2$ and $s_3$ are similarly constructed. As evident from FIG. 4, multiple OFDM symbols are transmitted within a single OFDM symbol period. For example, during OFDM symbol period OSP2, OFDM symbols OFDM(1,2), OFDM(2,2), and OFDM(3,2) are transmitted in signal streams $s_1$, $s_2$, $s_3$, respectively. As known in the art, the header portion associated with each frame (i.e., multiple symbol OFDM structure, or packet) includes any necessary overhead and control information regarding the communication, other than the content of the communicated data itself.

As mentioned above, fixed block size error correction coding provides important benefits in the error correction of high data rate communications. An important class of fixed block size coding is Low Density Parity Check (LDPC) coding, which has particularly shown excellent coding performance and also lends itself to efficient implementation in encoder and decoder hardware. It has been discovered, in connection with this invention, that it is difficult to efficiently implement of a fixed block size coding scheme, such as LDPC, into MIMO communications, particularly MIMO OFDM communications. With reference to FIG. 4, for example, the LDPC block size and code rate does not necessarily align with OFDM symbol period boundaries. Rather, it is very likely that an LDPC-coded payload block will leave empty symbol periods in one or more of the multiple signal streams $s_1$ through $s_3$. Considering the number of coded data blocks transmitted over a typical network link, the effect of these empty symbols on the overall data transmission efficiency can be significant.

Figure 5:
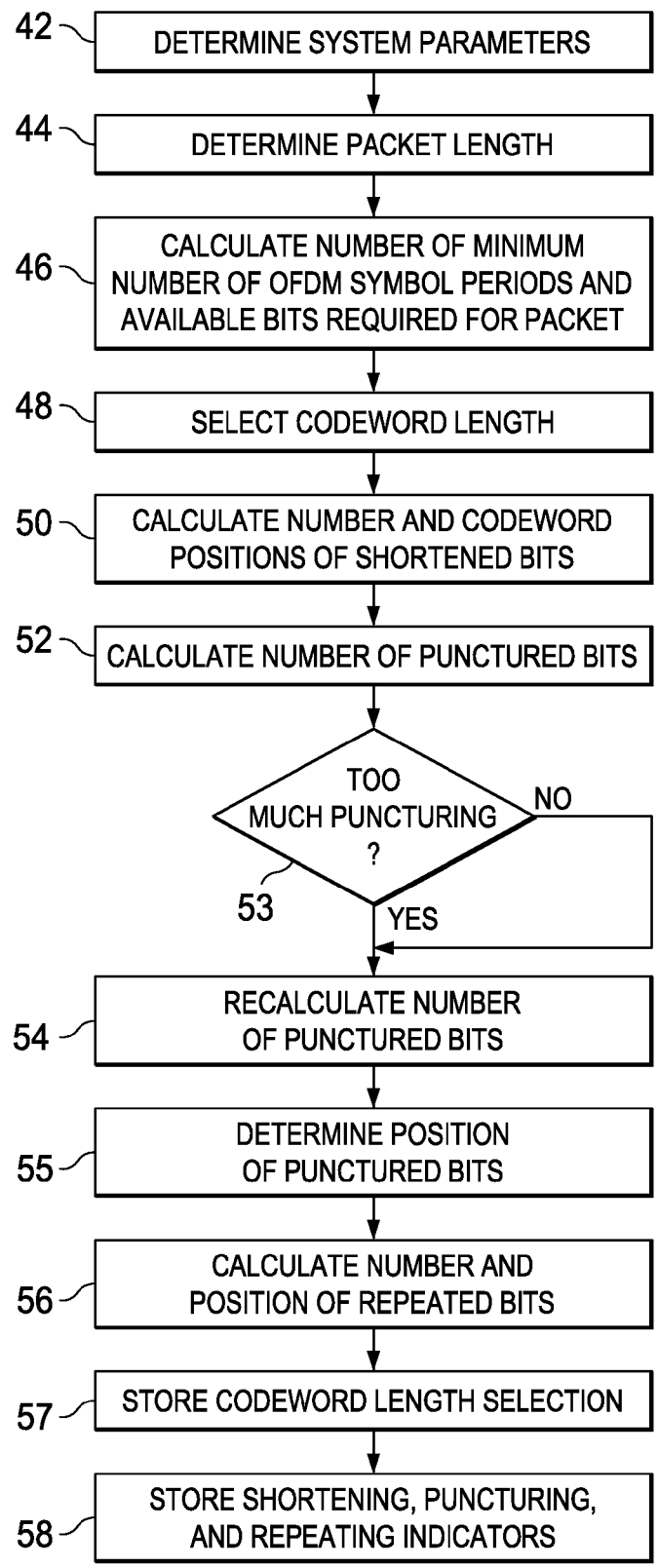
FIG. 5 is a flow diagram illustrating the operation of the transceiver of FIG. 3 in selecting and arranging codeword sizes according to the preferred embodiment of the invention.

Referring now to FIG. 5, the operation of transceiver 15 in selecting and arranging an optimized codeword length and codeword arrangement for a MIMO OFDM network link, according to the preferred embodiment of the invention, will now be described. As discussed above, this operation can be performed by special logic circuitry such as shown by code select function 41 of FIG. 3, or alternatively by more general purpose logic or processor circuitry within transceiver 15, depending on the hardware architecture. Also as discussed above, it is contemplated that this operation will typically be carried out by transceiver 15 somewhat frequently, possibly as frequently as for each packet being transmitted; this process is contemplated to involve relatively little computational complexity, and as such is contemplated to be rapidly executable by modem logic circuitry. In addition, as discussed above, it is contemplated that transceiver 15 will also carry out this operation of selecting the codeword length and arrangement not only for packets being transmitted, but also for incoming received packets. It is contemplated, in this regard, that the simplicity of this operation permits such calculation by the receiver function, thus avoiding the need for the transmitter to encode and modulate additional control information as necessary to communicate the codeword length and arrangement to the receiver. Of course, the algorithm or approach executed by the transmitter and receiver must be at least substantively equivalent in order for both ends of the communication channel to arrive at the same answer.

This operation begins with process 42, in which system and network link parameters germane to the selection of the LDPC codeword length and the arranging of the codeword structure are determined. According to this preferred embodiment of the invention, these parameters include the desired code rate, the number of bits to be encoded within each OFDM symbol period, and whether space-time block coding (i.e., transmitting a single spatial stream of data over two antennae) is to be enabled. These parameters are typically contained within the preamble or header of the packet, for example as forwarded by MAC 37 to baseband processor 39 of FIG. 3 for transmitted packets, or are otherwise derivable from this information; for received packets, it is contemplated that these parameters are contained within the transmitted header of packets over each of the multiple communications channels, or are otherwise derivable, as known in the art. In process 44, the length of the data packet to be transmitted is determined. Typically, this data packet length is specified within each packet, for example by a data length field within its header or preamble.

Once these system and packet length parameters are determined, the number of available bits and minimum number of OFDM symbol periods required for a packet are derived, in process 46. According to the preferred embodiment of the invention, process 46 first determines the number $N_{pld}$ of payload bits to be transmitted for a packet of length packet_length (in bytes) as:

$$N_{pld} = \text{packet\_length} \times 8 + 16$$

considering that sixteen bits are required for overhead information in each packet. In process 46, the minimum number $N_{OFDM-MIN}$ of OFDM symbol periods is then derived, using the number $N_{pld}$ of payload bits, the code rate R ($R \leq 1$), and the number $N_{CBPS}$ of coded bits per OFDM symbol period (i.e., the number of bits per OFDM symbol times the number of signal streams):

$$N_{OFDM-MIN} = \alpha_{STBC} \times \left\lceil \frac{N_{pld}}{N_{CBPS} \times R \times \alpha_{STBC}} \right\rceil$$

where $\alpha_{STBC}$ is an indicator of whether STBC is enabled ($\alpha_{STBC}=1$ if no STBC, $=2$ if STBC is enabled), and where ⌈ ⌉ indicates the ceiling function (i.e., smallest integer greater than or equal to the argument). For example, if the arrangement of FIG. 4 were used to encode and transmit a packet, the number of symbol periods from OSP1 to OSPn would correspond to the calculated minimum number $N_{OFDM-MIN}$ of OFDM symbol periods, where each OFDM symbol period corresponds to the period of time in which each signal stream s transmits an OFDM signal. Process 46 uses this minimum number $N_{OFDM-Min}$ of OFDM symbol periods to then derive number $N_{av}$ of available bits within this minimum number $N_{OFDM-MIN}$ of OFDM symbol periods:

$$N_{av} = N_{CBPS} \times N_{OFDM-MIN}$$

Once the number $N_{av}$ of available bits is determined in process 46, the LDPC codeword length $L_{LDPC}$ and the number of codewords $N_{CW}$ required for encoding the packet are determined, in process 48. According to the preferred embodiment of this invention, the codeword length selection of process 48 follows predetermined selection criteria. This selection may be realized by way of combinational or sequential logic, or by a sequence of program instructions, or also by way of a look-up table. In effect, the selection of process 46 is preferably a rule-based determination that, for this example of the preferred embodiment of the invention, can be summarized in a tabular form as:

TABLE 1

| $N_{av}$ | Number of codewords = $N_{CW}$ | Codeword length = $L_{LDPC}$ |
|---|---|---|
| $N_{av} \leq 648$ | 1 | 1296, if $N_{av} \geq N_{pld} + 912(1-R)$<br>648, otherwise |
| $648 < N_{av} \leq 1296$ | 1 | 1944, if $N_{av} \geq N_{pld} + 1464(1-R)$<br>1296, otherwise |
| $1296 < N_{av} \leq 1944$ | 1 | 1944 |

TABLE 1-continued

| $N_{av}$ | Number of codewords = $N_{CW}$ | Codeword length = $L_{LDPC}$ |
|---|---|---|
| $1944 < N_{av} \leq 2592$ | 2 | 1944, if $N_{av} \geq N_{pld} + 2916(1-R)$<br>1296, otherwise |
| $2592 < N_{av}$ | $\left\lceil \dfrac{N_{pld}}{1944 \cdot R} \right\rceil$ | 1944 |

This Table 1 illustrates a preferred arrangement for LDPC coding in an MIMO OFDM environment according to the IEEE 802.11n draft standard. Of course, other network protocols and configurations will likely be reflected in different selection criteria and different codeword lengths from those shown in Table 1. In any case, given the complexity of the decision-making involved in code word selection, it is contemplated that the selection of process 48 will be best accomplished by way of a predetermined table or other rule-based system, similar to that of Table 1. It is contemplated that those skilled in the art having reference to this specification will be readily able to derive a particular set of rules for other alternative environments and criteria, and as such Table 1 in this specification is provided by way of example only.

Alternatively, the code rate may also be selected in response to the various system parameters and packet length, rather than used as an input as in the preceding description. According to this alternative approach, the number $N_{OFDM\text{-}MIN}$ of OFDM symbol periods and the number $N_{av}$ of available bits are each calculated using a base code rate $R_0$, and according to a rule-based determination as described above. An optimum code rate R can then be selected as the nearest value in a predetermined set of code rates (e.g., from the set {1/2, 2/3, 3/4, 5/6}) that is greater than or equal to the ratio of the number $N_{pld}$ of payload bits to the number $N_{av}$ of available bits in the minimum number of OFDM symbol periods.

Following selection of the codeword length, and code rate if desired, the number and positions of bits to be "shortened" from the codewords are next selected, in process 50. As known in the art, codeword shortening is a known technique by way of which a selected number of information bits in a systematic codeword are forced to a known state (e.g., "0"), and therefore need not be transmitted. A full complement of parity bits is derived from all of the information bits including the forced-value bits, and is transmitted with each codeword. Shortening techniques are useful in situations in which the code word length is constrained, but in which the data to be transmitted will not completely fill the entire length of the information portion of the full codeword. Code "shortening" results in a reduction in the overall code rate, however, considering that the same number of information bits and total bits are not transmitted in the shortened code word (in the code rate ratio, both the numerator and the denominator are reduced by the same absolute value). Shortening tends to improve the performance of the code, however, because there is less overall uncertainty in the full codeword after shortening is reversed in the receiver (i.e., the state of the shortened bits is known with certainty).

According to the preferred embodiment of the invention, shortening is applied, in LDPC coding, by padding a selected number of bits (the shortened bits) to the payload data bits $N_{pld}$ prior to LDPC encoding, for each codeword. This selected number $N_{shrt}$ of shortened bits is determined by comparing the number of available information bits in the code words to the number of payload bits $N_{pld}$:

$N_{shrt} = (N_{CW} \times L_{LDPC} \times R) - N_{pld}$

These $N_{shrt}$ bits to be shortened from the number of codewords $N_{CW}$ for a packet are preferably evenly distributed, with the first $\text{rem}(N_{shrt}, N_{CW})$ codewords (i.e., the number of codewords corresponding to the remainder of the division $N_{shrt}/N_{CW}$) for a packet having one additional shortened bit than the others. While any bits within the information portion of the systematic codewords may be the shortened bits (i.e., encoded at a known state, but discarded before modulation and transmission), it is preferable to select a standard location for the shortened bits (e.g., the right-most bits in the information portion of each codeword).

Figure 7A:
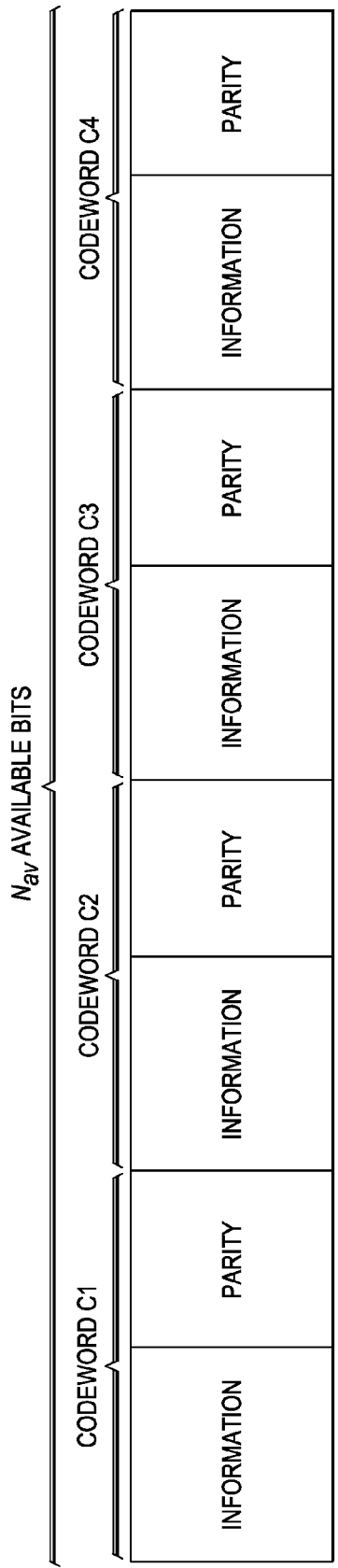
FIGS. 7a through 7e illustrate sequences of codewords as arranged within the bits available to OFDM symbols within a MIMO environment.
Figure 7B:
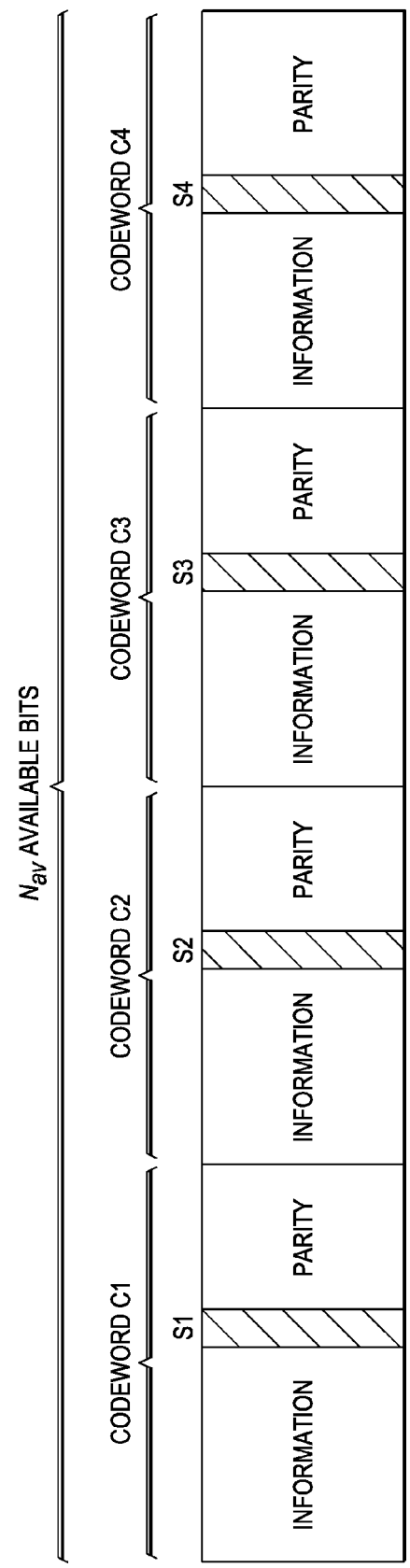

For example, FIG. 7*a* illustrates a sequence of four codewords C1 through C4, each having an information and a parity portion, in a sequence of $N_{CW}$ codewords of length $L_{LDPC}$ that exactly fill the number $N_{av}$ of available bits derived from the number $N_{OFDM\text{-}MIN}$ of symbol periods and number $N_{CBPS}$ of coded bits per symbol period. In the case of FIG. 7*a*, no shortening is necessary because the payload contained within the codewords C1 through C4 exactly matches the information capacity of the number $N_{av}$ of available bits, for this code rate. However, as will be readily imagined by the skilled reader of this specification, this exact match seldom occurs. FIG. 7*b* illustrates the case in which the information capacity in the number Nav of available bits, for this code rate, is greater than the number $N_{pld}$ of payload bits to be transmitted. In this event, a number of shortened bits will be calculated as described above relative to process 50. These shortened bits are distributed among the codewords in the sequence, for example as shown in FIG. 7*b* by information portions S1 through S4 in each of codewords C1 through C4. The bits in these portions S1 through S4 (which, in this example, are the right-most bits of the information portions of the corresponding codewords), will be forced to a known state (e.g., 0) prior to LDPC encoding, and will not be transmitted. The receiver will fill in these known states into the shortened bit portions S1 through S4, prior to LDPC decoding.

Upon the completion of shortening process 50, according to the preferred embodiment of the invention, a number $N_{punc}$ of bits to be punctured from the codewords is next calculated, in process 52. As known in the art, the puncturing of a code is performed by simply not transmitting certain bits of the code word, such bits either residing in the information portion or the parity portion of the codeword. In decoding the transmitted punctured code word, the missing bits are reconstructed as a result of the "correction" properties of the coding. The receiver, of course, must know which bits of the code word were punctured, in order to accurately retrieve the information; the receiver considers these bits as of an indeterminate state, or sets their values to an initial value that is corrected in the decoding process. In general, puncturing increases the code rate of the transmission, at a cost of code performance (i.e., higher error rate for a given SNR, or higher SNR required for a given error rate).

According to the preferred embodiment of the invention, the number $N_{punc}$ of bits to be punctured is derived by considering whether the encoded codewords, as shortened, fit within the number $N_{av}$ of available bits to be transmitted in the MIMO packet:

$$N_{punc} = \max[0, (N_{CW} \times L_{LDPC}) - N_{av} - N_{shrt}]$$

As such, the number $N_{punc}$ of punctured bits is non-zero if there are more bits in the number $N_{CW}$ of codewords multiplied by the codeword length $L_{LDPC}$ (i.e., the total number of codeword bits, information and parity, resulting from encoding of the payload) than there are available bits $N_{av}$ in the OFDM symbol periods, as shortened by $N_{shrt}$.

The calculated number $N_{punc}$ of puncturing bits may be sufficiently large that it may be preferable to increase the number $N_{av}$ of available bits, for example by adding another OFDM symbol period to transmit the packet, rather than to adversely affect the code performance by including a large number of indeterminate bits (i.e., the punctured bits). According to the preferred embodiment of the invention, decision 53 next determines whether the puncturing determined in process 52 is excessive, based on various criteria.

Figure 6:
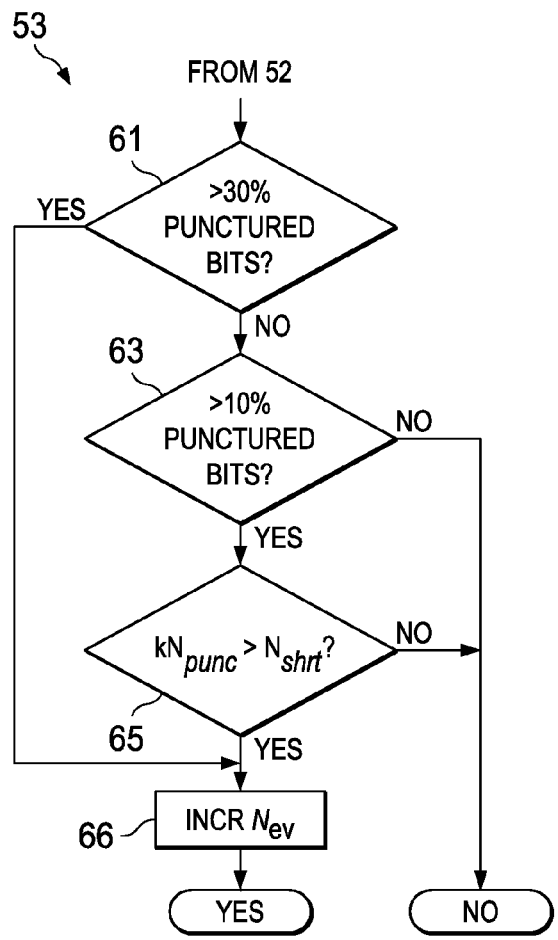
FIG. 6 is a flow diagram illustrating the operation of a code puncturing decision process in the operation of FIG. 5, according to the preferred embodiment of the invention.
Figure 8:
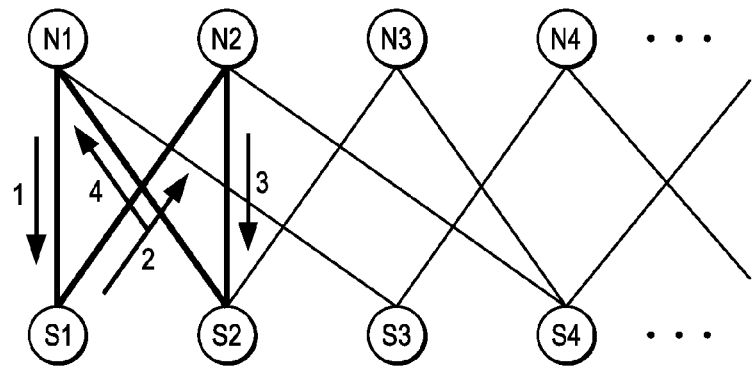
FIG. 8 is a Tanner diagram illustrating cycles, or closed paths, in an LDPC code, as analyzed according to conventional code selection methods.

FIG. 6 illustrates the operation of decision 53 in determining whether excessive puncturing is possible. According to the preferred embodiment of the invention, multiple criteria for the determination of decision 53 are utilized. In decision 61, the number $N_{punc}$ of punctured bits is compared against a measure of the total number of parity bits after encoding:

$$N_{punc} > 0.3 \times N_{CW} \times L_{LDPC} \times (1-R)$$

In other words, the criterion of decision 61 determines whether more than a relatively large fraction (30% in this example) of the total number of parity bits to be generated in the LDPC codewords, over all $N_{CW}$ codewords for the packet, are to be punctured. If this is the case (decision 61 is YES), control passes to process 66 in which the number $N_{av}$ of available bits is incremented by the number of codeword bits for an additional OFDM symbol period:

$$N_{av} \Leftarrow N_{av} + (N_{CBPS} \times \alpha_{STBC})$$

The parameter $\alpha_{STBC}$ is, as before, an indicator of whether STBC is enabled ($\alpha_{STBC}=2$) or not ($\alpha_{STBC}=1$). Control then passes to process 54 (FIG. 5), in which the number $N_{punc}$ of punctured bits is recalculated, based on this incremented number $N_{av}$ of available bits.

If the number $N_{punc}$ of punctured bits is not sufficiently high to relative to the number of parity bits to be generated (i.e., if decision 61 is NO), decision 63 then determines whether the number $N_{punc}$ of punctured bits meets a lower criterion relative to the number of parity bits:

$$N_{punc} > 0.1 \times N_{CW} \times L_{LDPC} \times (1-R)$$

In other words, the criterion of decision 63 determines whether more than a somewhat lower fraction (10% in this example) of the total number of parity bits to be generated in the LDPC codewords, over all $N_{CW}$ codewords for the packet, are to be punctured. If this criterion is not met (decision 63 is NO), the result from decision 53 as a whole is NO, and control passes forward to process 55 (FIG. 5). On the other hand, if this criterion is met (decision 63 is YES), decision 65 is next performed to analyze the ratio of shortened bits $N_{shrt}$ to punctured bits $N_{punc}$. For example, according to this preferred embodiment of the invention, the criterion of decision 65 may be expressed as:

$$N_{shrt} < 1.2 \times N_{punc} \times \frac{R}{1-R}$$

The weighting factor of 1.2 in this example may, of course, be adjusted according to the particular implementation and desired sensitivity of decision 65. In effect, decision 65 compares the fraction of information bits that are shortened to the fraction of parity bits that are punctured so that the number of symbol periods can be incremented if the fraction of punctured bits is large relative to the fraction of shortened bits. As such, if the criterion of decision 63 is met but the criterion of decision 65 is not met (NO), the number $N_{punc}$ of punctured bits is considered appropriate for the current configuration, and control passes to process 55, shown in FIG. 5. On the other hand, if the criterion of decision 65 is met (YES), the number $N_{av}$ of available bits is incremented in process 66, and the number $N_{punc}$ of punctured bits recalculated in process 54.

The recalculation of the number $N_{punc}$ of punctured bits, as carried out in process 54, is identical to the original calculation of the number $N_{punc}$ of punctured bits described above relative to process 52, except that the number $N_{av}$ of available bits used in this calculation is that as incremented by process 66 of decision 53, as described above. It is contemplated that only a single recalculation of the number $N_{punc}$ of punctured bits (i.e., a single instance of process 54) will be performed, according to the preferred embodiment of the invention; alternatively, decision 53 may be performed after recalculation process 54, and recalculation process 54 repeated based on that decision 53, if desired. In either case, upon completion of recalculation process 54, or if decision 53 indicates that puncturing is not excessive (i.e., decision 53 returns a NO result), process 55 is next performed to determine the position of the punctured bits within the codewords.

It is contemplated that the approach of determining and recalculating the number of punctured bits, according to this preferred embodiment of the invention, particularly as including the combination of criteria including the number $N_{punc}$ of punctured bits relative to the number of parity bits to be generated, is particularly beneficial in maintaining efficient MIMO OFDM communications. This combination of criteria has been observed, according to this invention, to greatly reduce the likelihood that more than one additional OFDM symbol period will be required, as a result of excessive puncturing, in order to transmit the sequence of codewords. According to this preferred embodiment of the invention, additional OFDM symbol periods need not be added in those cases in which the number of punctured bits is not a substantial fraction (e.g., <10%) of the number of parity bits, even if an imbalance in the ratio of shortened to punctured bits is present.

As in the case of the shortened bits, the bit positions of the punctured bits are arbitrary; of course, also as in the case of shortening, it is useful to settle upon a standardized position for the punctured bits to avoid miscommunication between encoding and decoding. For example, the punctured bits may be equally distributed over all $N_{CW}$ codewords, with the first $rem(N_{punc}, N_{CW})$ codewords being punctured one bit more than the others; preferably, these punctured bits within a codeword are constrained to a particular location (e.g., rightmost bits of the parity portion). The determination of the bit positions of these punctured bits within the codewords is effected in process 55.

Figure 7C:
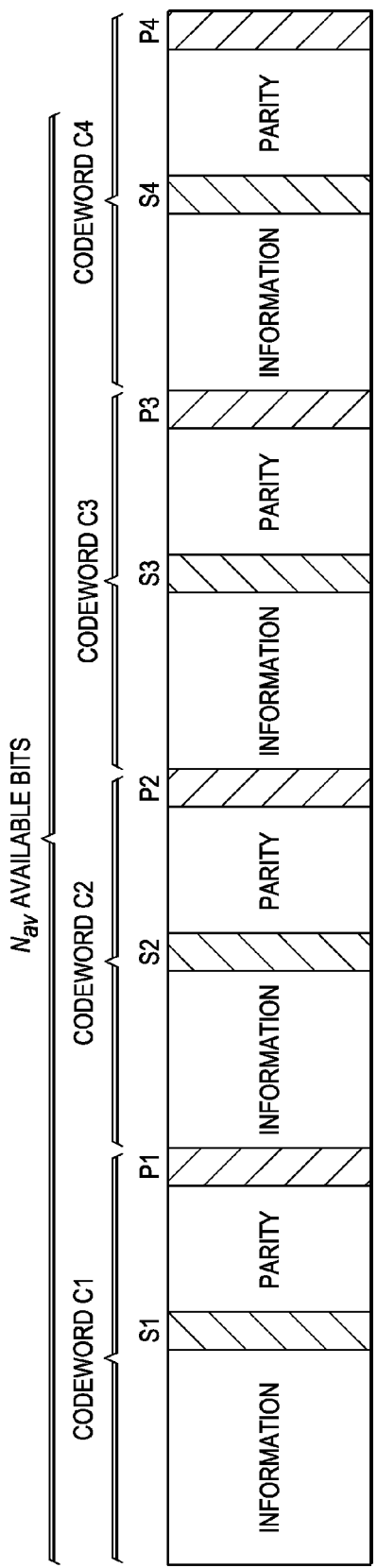

FIG. 7c illustrates the sequence of four codewords C1 through C4 in a situation which the number $N_{av}$ of available bits is less than the number of bits in a sequence of $N_{CW}$ codewords of length $L_{LDPC}$, even after shortening in process 50. In this event, a number of punctured bits will be calculated as described above. These punctured bits are preferably distributed among the codewords in the sequence, for example as shown in FIG. 7c by punctured parity portions P1 through P4 in each of codewords C1 through C4. The bits in these portions P1 through P4 (which, in this example, are the right-most bits of the parity portions of the corresponding codewords), are simply not transmitted. The receiver will derive the states in these punctured bit portions P1 through P4 during LDPC decoding, for example by way of a conventional iterative message passing algorithm. The combination of shortening and puncturing, in the case of FIG. 7c, permits the sequence of codewords C1 through C4 to be transmitted within the number $N_{av}$ of available bits.

As evident from the foregoing description, it is possible that no puncturing is necessary, specifically if the number $N_{punc}$ of punctured bits is calculated as zero. In this case, excess bit positions likely remain within the OFDM symbol periods that would not be filled by the codewords. These bit positions within the OFDM symbols must, of course, be filled with some data state. According to this preferred embodiment of the invention, these excess bit positions are set to a known or arbitrary state for encoding by repeating portions of the codewords. In order to effect this repeating, it is of course necessary to determine the number and position of those repeated bits, as well as derive the contents to be stored in those bits, as will now be described in connection with process 56.

As mentioned above, control passes to process 56 upon a determination that the number $N_{punc}$ of punctured bits is not excessive (decision 53 is NO). Of course, if the number of punctured bits is zero, this will be the result. In process 56, the number $N_{rep}$ of bits to be repeated, in order to fill the OFDM symbols to be transmitted, is calculated:

$$N_{rep} = \max(0, N_{av} - (N_{CW} \times L_{LDPC} \times (1-R)) - N_{pld})$$

As evident from this equation, the number $N_{rep}$ of repeated bits (if non-zero) effectively amounts to the number of available bits less the sum of the number parity bits in the codewords plus the number $N_{pld}$ of payload bits for the packet. Those skilled in the art will realize from this description that bits will not be repeated in a codeword arrangement in which puncturing occurs, and also that puncturing will not occur in a codeword arrangement in which bits are being repeated. The repeating of bits and puncturing of bits are thus, in effect, mutually exclusive from one another. Again, the positions of the bits that are to be repeated may be selected arbitrarily, although it is preferred that the manner of selection of these bits be kept constant to avoid confusion. Preferably, the repeated bits are equally distributed over all $N_{CW}$ codewords, with the first rem($N_{rep}$, $N_{CW}$) codewords having one additional repeated bit relative to the others, and with the repeated bits for a codeword repeated within the portion of the available bits associated with that codeword. According to this preferred embodiment of the invention, the bit content to be repeated will begin with the left-most systematic information bits, extending into the parity bits if necessary. If the number of bits to be repeated for a codeword exceeds the number of information and parity bits of that codeword, at least part of the codeword bit content will be repeated as necessary to fill the OFDM symbols. It is contemplated that this multiple repeating of the codeword content will generally occur in situations in which only a single codeword is to be transmitted within a MIMO OFDM packet, especially if the spatial diversity and modulation complexity (i.e., bits per tone) are relatively high.

Figure 7D:
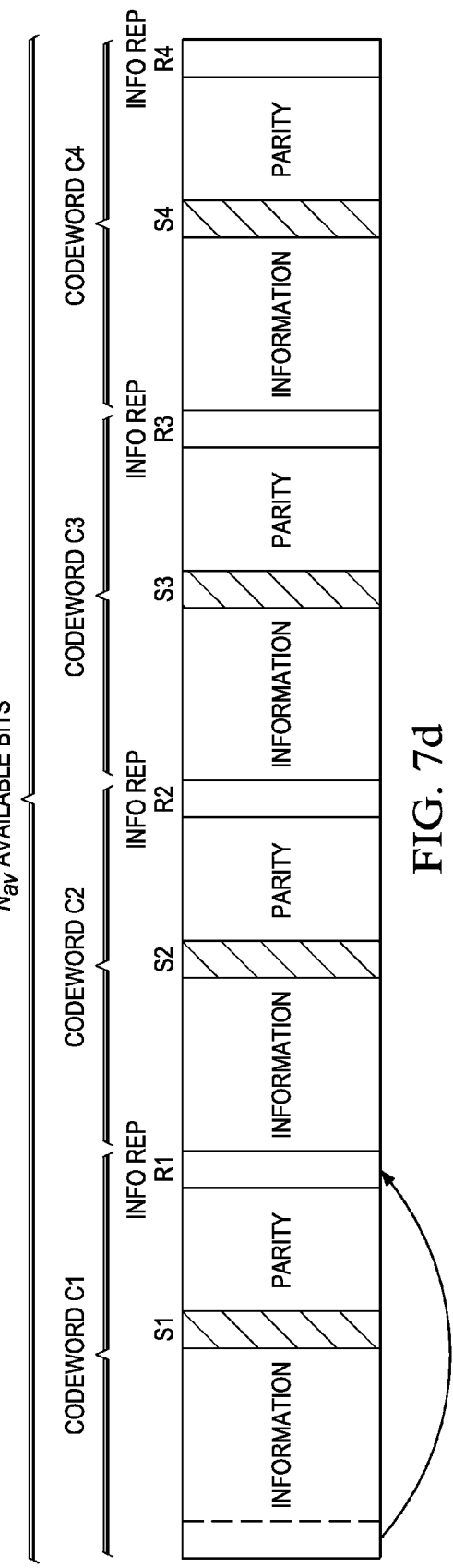

FIG. 7d illustrates an example of the repeating of codeword bits. In this case, the number $N_{av}$ of available bits exceeds the number of bits in the sequence of codewords C1 through C4, as shortened by portions S1 through S4, respectively. In this case, the bits to be repeated are the left-most information bits from each codeword C1 through C4 in the sequence. As shown in FIG. 7d, these repeated bits R1 through R4 for each codeword C1 through C4, respectively are appended to the end of the corresponding codeword throughout the sequence. This repeating over all of the codewords in the sequence fills the number $N_{av}$ of available bits defined by the symbol periods and coded bits per symbol period, as described above. In the example of FIG. 7d, each portion R1 through R4 corresponds to less than the full information of its corresponding codeword C1 through C4, respectively; as mentioned above, however, the repeated bits can extend into the parity portion of each corresponding codeword C1 through C4 if necessary.

Figure 7E:
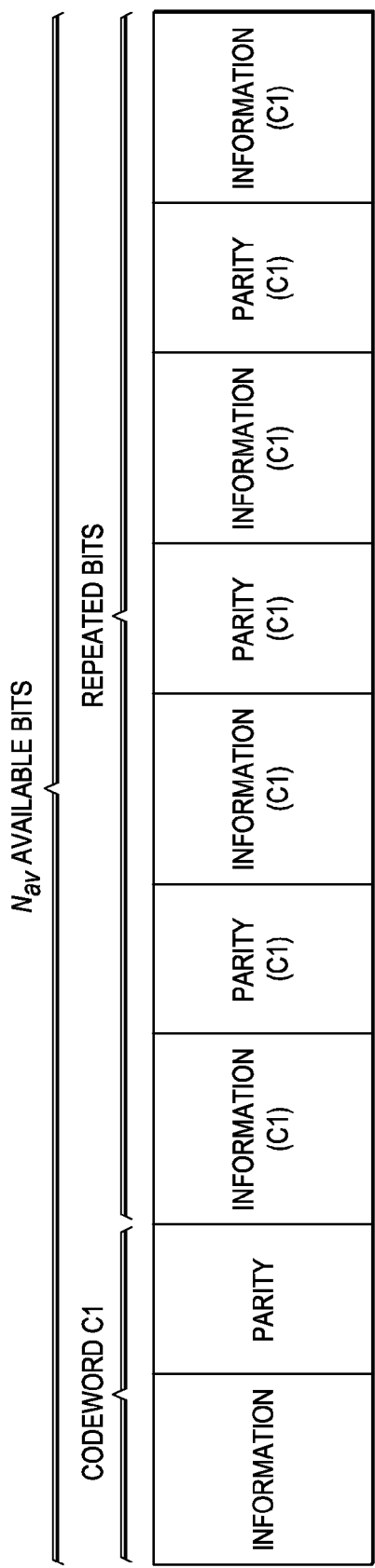

FIG. 7e illustrates the situation in which the number $N_{av}$ of available bits greatly exceeds the number of coded bits in the sequence of codewords to be transmitted. In this case, the sequence only includes a single codeword C1. One repetition of the full codeword C1 is insufficient, in this case, to fill the number $N_{av}$ of available bits. This codeword C1 may be shortened as described above (such shortening is not illustrated in FIG. 7e); indeed, the shortening of codeword C1 may itself cause this shortfall in the number of coded bits relative to the number $N_{av}$ of available bits. According to this preferred embodiment of the invention, the number $N_{av}$ of available bits in the symbol periods to be transmitted is filled by again repeating the repeated bits, beginning again with the information portion of codeword. While, in this illustrated example, the number $N_{av}$ of available bits is filled with a partial third repetition of codeword C1, it is of course contemplated that this repeating may require multiple repetitions of information within each of the codewords. As mentioned above, it is contemplated that this repeating situation will occur primarily, if not exclusively, in instances in which a single codeword C1 is being transmitted within a MIMO OFDM packet, although multiple repetitions may be applied, in similar fashion, in cases with two or more codewords being transmitted.

In any event, the receiving transceiver 15 will be able to discern the number of repeated bits, from the system parameters included within the preamble or header of the transmitted packets, and will treat the terminal portion of the received and concatenated signal as repetitions of the true codeword portions, upon decoding.

The codeword length selection and arrangement operation according to this preferred embodiment of the invention closes with process 57, in which the selected codeword length (and code rate, if so selected) is stored in memory. In process 58, indicators are stored, for example in code memory 40 (FIG. 3), so that LDPC encoder/decoder circuitry 38 is made aware of the number and position of shortened bits, punctured bits, and repeated bits. Following processes 57, 58, transceiver 15 is ready for encoding of the payload communicated on input datastream TX_DATA, according to the functional datapath illustrated in FIG. 2a, and parsing of the encoded datastream into the multiple signal streams $s_1$ through $s_3$, as described above.

As described above, the codeword length selection and arrangement operation is contemplated to not only be carried out on the transmitting side of the communications link, but also by the receiver. As known in the art for MIMO OFDM communications, the preamble or header portions of transmitted data packets includes parameters from which the receiver can determine the desired code rate, the number of bits to be encoded within each OFDM symbol period, whether space-time block coding is used in the transmitted packet, and the like. The receiver preferably repeats the operations of codeword length selection and arrangement substantially in the same manner as described above relative to FIGS. 5 through 7e, and will arrive at the same "answer" as did the transmitter, because the same input parameters and same algorithm are used. Upon completion of this process, the receiver will then comprehend how the incoming symbols are arranged, from an LDPC coding standpoint, and will be readily able to reverse the process to recover the original data communication. The relatively modest computational load involved in this codeword length and arrangement selection process renders the calculation of these results at the receiver much more efficient than would be the communication of this information within the packet.

In addition to the determination of the structure and arrangement of the LDPC code, the specific LDPC code itself must also be defined in order to carry out coded communications. As previously mentioned, it has been discovered that there can be a wide variation in code performance among codes having the same structure and codeword size. The code "performance" of an error correcting code refers, of course, to the error rate of coded communications using the code (encoding and decoding) for a given level of noise. Typically, the performance of an ensemble of codes is compared by way of simulation, plotting the error rate of each code over a range of signal-to-noise ratios, where the simulated noise is additive white Gaussian noise (AWGN).

As discussed above in connection with the background of this invention, it is known to analyze LDPC codes for the presence of "cycles", or "closed paths", in determining which of an ensemble of potential LDPC codes may have the best code performance. Kang et al., "Flexible Construction of Irregular Partitioned Permutation LDPC Codes with Low Error Floors", *Communication Letters*, Vol. 9, No. 6 (IEEE, June 2005), pp. 534-36, describes the selection of LDPC codes by avoiding small "cycles" or "closed paths" in the Tanner graph of a code. Similarly, Zhang et al., "VLSI Implementation-Oriented (3,k)-Regular Low-Density Parity-Check Codes", *IEEE Workshop on Signal Processing Systems* (September 2001), pp. 25-36, describes a somewhat similar approach, referring to a "girth average", in which the length of the shortest cycle passing through each node is averaged over the total number of nodes for the code; this girth average is determined over an ensemble of codes to select candidate codes, which are then analyzed for their simulated error rates. It is known that the presence of small "stopping sets", or the presence of "cycles" of short length, in the Tanner graph of a given code is harmful to the error floor performance of that code. The Kang et al. letter describes an approach to selecting LDPC codes, by selecting codes that do not have closed paths below a threshold length (e.g., no closed paths of length four), and that have relatively low numbers of cycles of shorter lengths above that threshold.

The Kang et al. letter further describes the selection of codes with reference to the "approximate cycle extrinsic message degree", or "ACE", of the code. This approach to code selection is useful, but does not in and of itself result in the selection of an optimal code. Indeed, it has been discovered, in connection with this invention, that the extrinsic message degree analysis can result in an ensemble of codes that still may have a wide range of bit error rate performance. Furthermore, bit error rate performance of the code is an especially sensitive parameter in the MIMO OFDM environment described above.

Figure 9A:
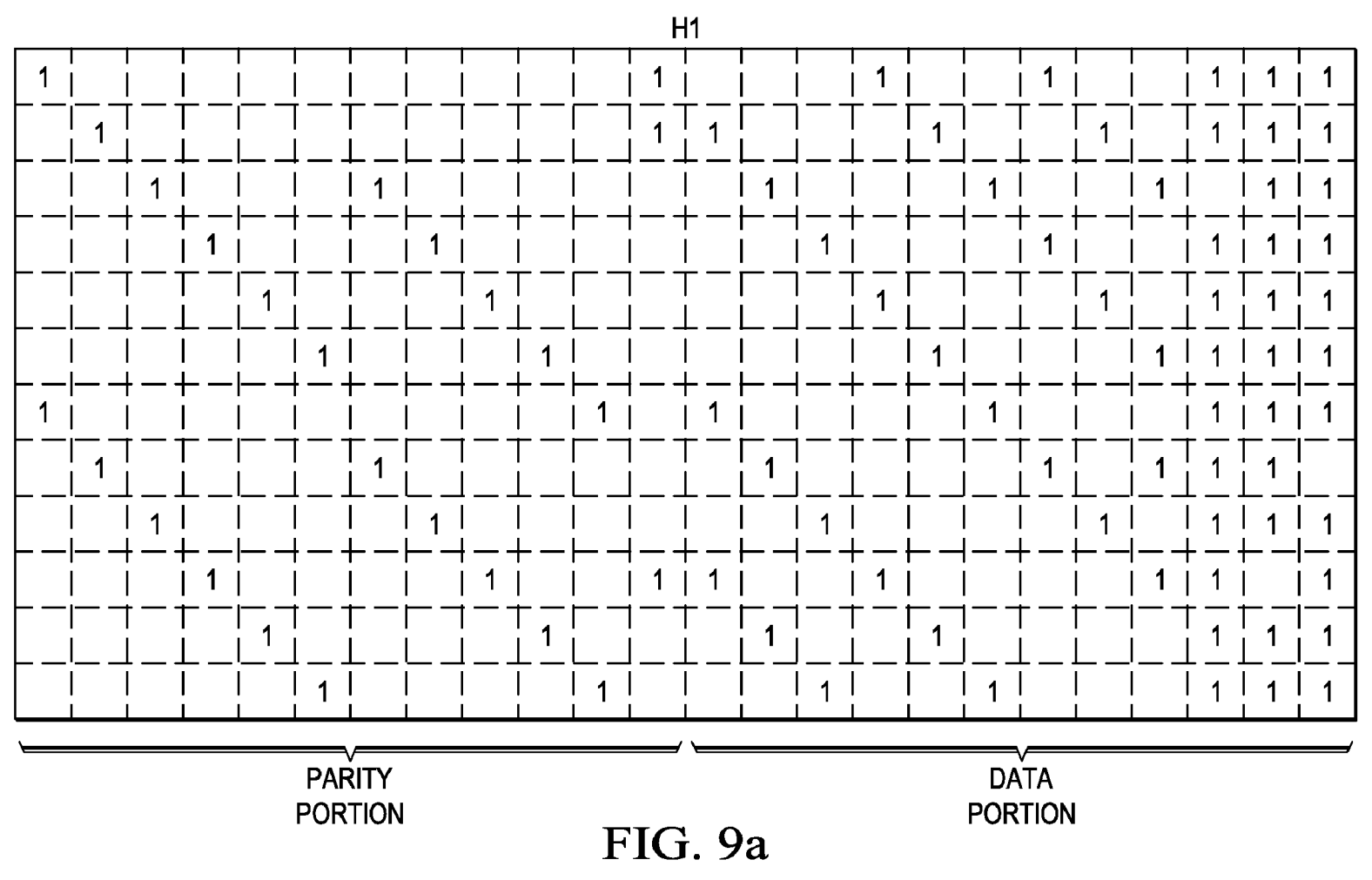

FIG. 9a illustrates macro matrix H1 of an LDPC code according to the preferred embodiment of the invention. As described in copending patent application Ser. No. 10/329, 597, filed Dec. 26, 2002, now published as U.S. Patent Application Publication No. US 2004/0034828, and copending patent application Ser. No. 10/806,879, filed Mar. 23, 2004, and now published as U.S. Patent Application Publication No. US 2004/0194007 A1, both commonly assigned herewith and incorporated herein by this reference, macro matrix H1 represents and corresponds to a binary LDPC parity check matrix $H1_{pc}$. Binary, or coding, parity check matrix $H1_{pc}$ is a complete and full LDPC code matrix, in which each column corresponds to an input node, and each row corresponds to a checksum. According to this class of LDPC codes, including the codes according to the preferred embodiment of the invention, macro matrix H1 represents parity check matrix $H1_{pc}$ in a "macro" form, with each non-zero entry in macro matrix H1 representing a p×p permutation matrix (e.g., a circularly shifted identity matrix). As such, each entry in macro matrix H1 corresponds to $p^2$ entries of binary parity check matrix $H1_{pc}$. In the arrangement illustrated in FIG. 9a, each entry of macro matrix H1 has either a 1 or a 0 value, where an entry with a 1 value symbolizes a p×p permutation matrix at that position within parity check matrix $H1_{pc}$, while entries with a 0 value (shown as blank entries in FIG. 9a) symbolize a p×p zero matrix. The representation of FIG. 9a does not indicate the shift position of the diagonal within each 1 entry, however, but merely indicates which entries correspond to a non-zero circularly shifted identity matrix, and which entries are zero entries. Also in the arrangement of FIG. 9a, each column of macro matrix H1 (i.e., a "block" column, containing p columns, of parity check matrix $H1_{pc}$) corresponds to p input nodes of the coding equation; each row of macro matrix H1 (i.e., a "block" row, containing p rows, of parity check matrix $H1_{pc}$) corresponds to p checksums of the coding equation. As discussed above relative to the Background of the Invention, the coding equation is $H1_{pc} \cdot c = 0$, where c is the codeword; this equation requires that all checksums add to zero.

The LDPC code according to this preferred embodiment of the invention is a systematic code, in that the payload data is explicitly contained within the encoded codeword. In the arrangement shown in FIG. 9a, the data portion of the codeword is applied to the portion of macro matrix H1 with the heavier column weights, while the portion of macro matrix H1 applied to the parity portion of the codeword has lower column weights, as shown. In this example, the code rate is ½, as evident by the data portion and the parity portion of macro matrix H1 each occupying twelve block columns. As will be discussed in more detail below, the rows and columns of macro matrix H1 can be re-ordered arbitrarily or for reasons of efficiency, without changing the coding equation, and thus without changing the code itself.

According to the preferred embodiment of this invention, each non-zero entry of macro matrix H1 is a circularly shifted identity matrix. As known in the art, circular shifting of an identity matrix refers to shifts of the diagonal of an identity matrix in modulo fashion. For example, given a 3×3 identity matrix:

$$\begin{pmatrix} 1 & 0 & 0 \\ 0 & 1 & 0 \\ 0 & 0 & 1 \end{pmatrix}$$

a circular shift of this identity matrix by one position to the right (or by one position upward) would result in the circularly shifted identity matrix:

$$\begin{pmatrix} 0 & 1 & 0 \\ 0 & 0 & 1 \\ 1 & 0 & 0 \end{pmatrix}$$

Figure 9B:
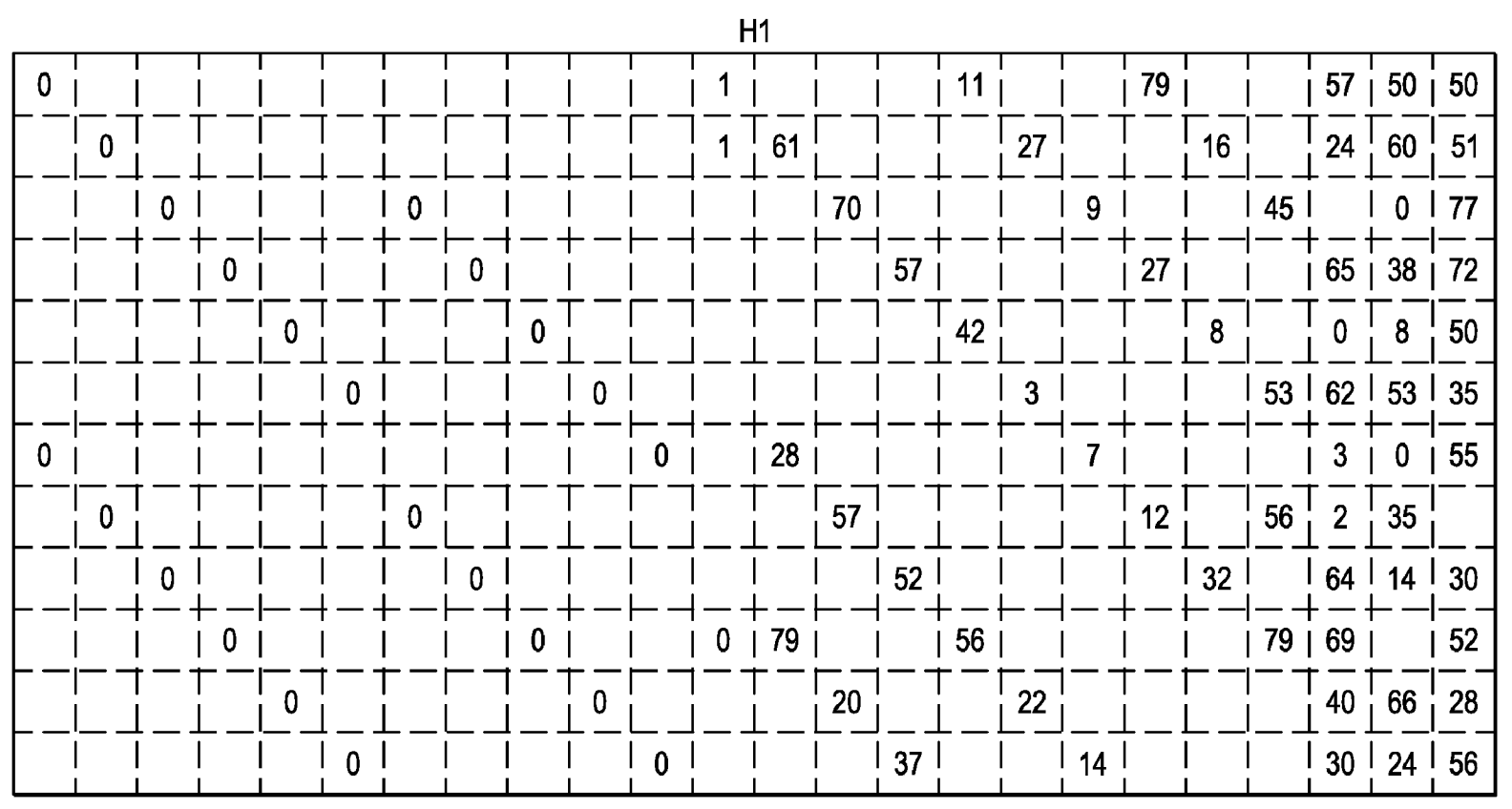

Of course, a circular shift of two positions is also possible in this 3×3 example. Therefore, the arrangement of circularly shifted identity matrices within macro matrix H1 shown in FIG. 9a does not completely specify the actual code. Both the size p of the circularly shifted identity matrix corresponding to each non-zero entry of macro matrix H1, and also the shift values within each entry of macro matrix H1, are required to fully specify the code. According to the preferred embodiment of the invention, the LDPC code has a permutation matrix size p of 81, with shift values as shown in FIG. 9b. As such, the code word size for the LDPC code according to this embodiment of the invention is 1944, and involves 972 checksums. In the MIMO OFDM environment described above, this code is suitable for relatively large packet payloads. In FIG. 9b, a "0" entry corresponds to no shift, which of course is the identity matrix itself (i.e., all "1" entries along the diagonal). All other shift values in FIG. 9b indicate shifts of the identity diagonal to the right within each circularly shifted identity matrix, or block matrix entry. While these values as shown in FIG. 9b correspond to right shifts, shifts of the identity diagonal to the left by the same values throughout the macro matrix would result in the same effective code. Blank entries in FIG. 9b refer to zero-valued p×p matrices.

As mentioned above, row reordering and column reordering may be applied to macro matrix H1 without changing the code itself. FIG. 10 illustrates the arrangement of the code of FIGS. 9a and 9b by way of macro matrix H1R, in which both block rows and block columns are re-ordered from the code as shown in FIGS. 9a and 9b. In the representation of FIG. 10, the zero-valued p×p matrices are shown by blank entries, while the numeric values shown for each entry indicate the number of right-shifts of the identity matrix within each entry (the value "0" indicating an unshifted identity matrix). As evident in FIG. 10, the parity portion corresponds to the right-hand twelve block columns of macro matrix H1R, and the data portion corresponds to the left-hand twelve block columns.

The claims presented in this patent application are not intended to claim the specific row and column ordering shown in FIG. 10, for the code of FIGS. 9a and 9b. Rather, the claims presented in this patent application are intended to cover the code of FIGS. 9a, 9b and 10, and such other codes as fall within the scope of the claims, regardless of row ordering and regardless of column ordering. Again, as mentioned above repeatedly, the ordering of the rows and columns within a macro matrix, or within a parity check matrix represented by a macro matrix, does not change the code itself.

Figure 11:
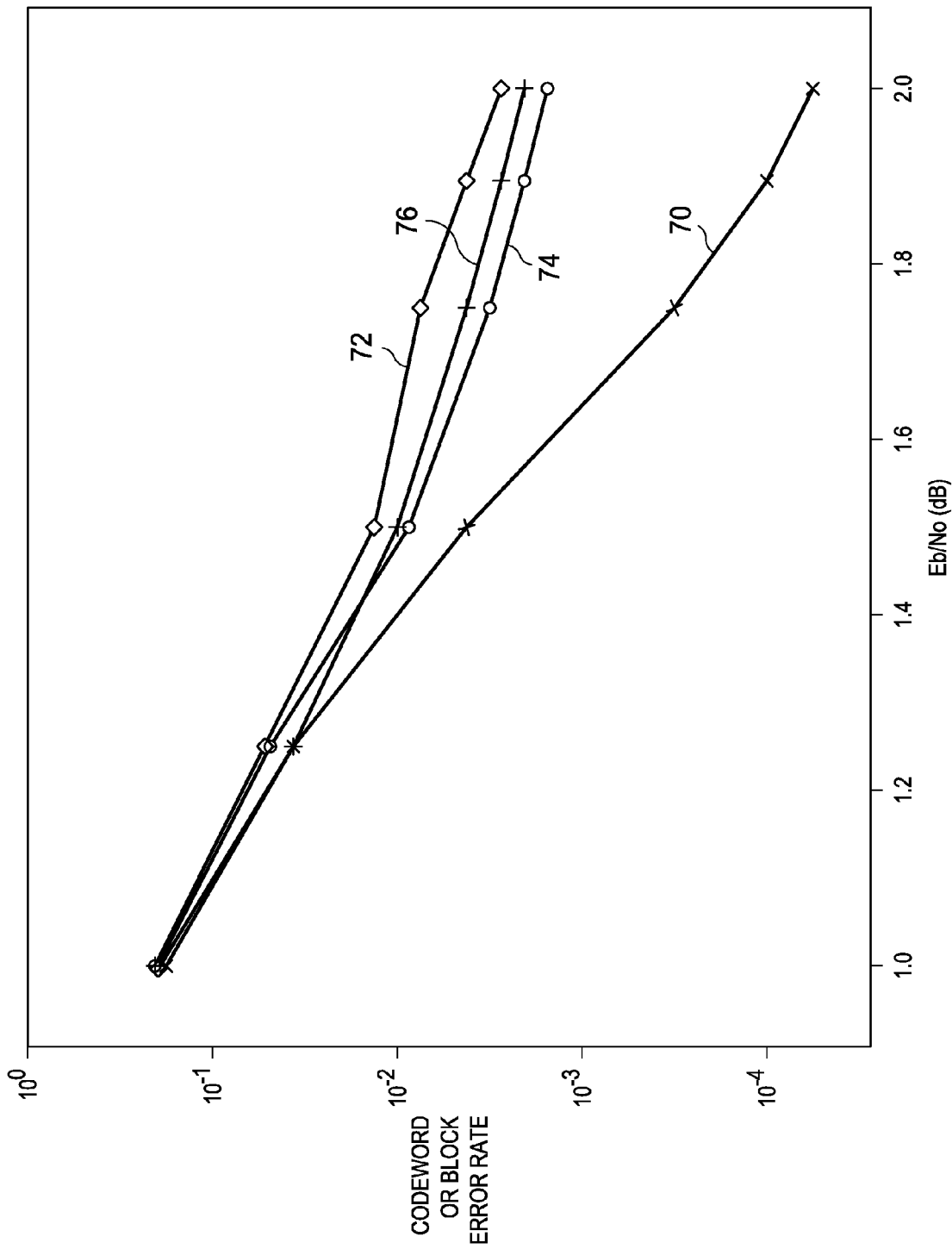
FIG. 11 is a plot of error rate performance for a code corresponding to that shown in FIGS. 9a and 9b, relative to other codes of a similar structure.

It has been discovered through simulation, in connection with this invention, that the code represented by FIGS. 9a and 9b and 10 provides outstanding error rate performance as compared to other similarly sized LDPC codes, including such LDPC codes that have the same code size, code rate, and even similar Tanner graph behavior, or extrinsic message degree ("ACE") behavior, as described above relative to the Kang et al. letter. FIG. 11 illustrates the codeword error rate performance of these candidate codes relative to one another, as that performance varies over a wide range of signal-to-noise ratio values. Plot 70 illustrates the error rate performance of the code of FIGS. 9a, 9b, and 10, as simulated over fifty standard belief propagation iterations. Plots 72 and 74 illustrate the simulated codeword error rate performance of two other LDPC codes of the same structure, code rate, codeword size, as that of the code plotted in plot 70, and that have similar graph analysis (extrinsic message degree behavior) as the code of FIGS. 9a, 9b, and 10, also over fifty standard belief propagation iterations. Plot 76 illustrates the codeword error performance of a code rate ½, 1944-bit, structured LDPC code, having a different macro structure and arrangement from that of the code of FIGS. 9a, 9b, and 10 (while having essentially the same structure in the parity portion), but with substantially the same column weighting and similar graph analysis (extrinsic message degree behavior) as the preferred code. The preferred LDPC code of FIGS. 9a, 9b, and 10, according to this invention, substantially outperforms each of these three alternative candidate codes, especially at higher signal-to-noise ratios.

It is preferred that the code word selection and arrangement processes, including the shortening and puncturing methods, described above relative to FIG. 5 are performed in arranging the codewords that utilize the LDPC codes according to the preferred embodiments of this invention. Alternatively, the LDPC codes according to the preferred embodiments of this invention may be arranged in the conventional manner, or in some other manner, without using the methods described above relative to FIG. 5.

Referring back to FIG. 2a, in the transmission of coded data according to the preferred embodiment of the invention, the LDPC code of the preferred embodiment of this invention is applied by LDPC encoder 11 to the data to be transmitted, in block form, as received on lines TX_DATA. Stream mapper 12 parses the code words among the multiple spatial streams, each served by a corresponding one of modulation and mapping function 5, as shown in FIG. 2a. Each of modulation and mapping functions 5 performs mapping of the encoded digital word into a QAM constellation, modulation into an OFDM symbol, followed by re-serializing into the time domain and analog processing for transmission. Conversely, referring to FIG. 2b on the receiving end, the communicated spatial streams C1 through C3 are received by signal processing channels 6 at a receiver, analog processed and demodulated, and then processed by way of MIMO detection and decoded from the QAM or other modulation scheme. After recombining into a single stream by stream combiner 27, LDPC decoder 28 then decodes the resulting data block using the same LDPC code as specified above, according to the preferred embodiment of the invention, to produce the decoded data to the host, for example on lines RX_DATA.

Of course, as mentioned above, the particular hardware and processing used to carry out transmission and reception using the LDPC codes of this invention may vary from that shown, for example from that shown in FIG. 3. Furthermore, the data flow used in transmission and reception may also vary from that illustrated in FIGS. 2a and 2b, and described above, especially depending on the particular communications application. For example, the LDPC codes of this invention may be used in connection with any coded communications, including data communication within a computer, wire-line communications, communications carried out in OFDM or discrete multitone modulation as well as over a single carrier, and the like. It is contemplated, however, that these codes will be particularly beneficial when used in the MIMO OFDM wireless communications environment, considering the special requirements of such communications.

The preferred embodiment of the invention provides important advantages in the efficiency and accuracy of data communications, especially in such environments as MIMO OFDM communications in wireless LAN and WAN links, because of the improved bit error rate provided by the LDPC codes of this invention. The improved performance of these codes is especially unexpected, considering that their extrinsic message degree analysis is not substantially different from other codes of the same structure.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of transmitting coded communications comprising the steps of:

receiving a block of payload data;

applying a low density parity check (LDPC) code to the block of payload data to encode the received block of payload data into a codeword, the LDPC code represented by a macro matrix arranged in block rows and block columns and in which each entry corresponds to either an 81×81 zero-valued matrix or corresponds to an 81×81 circularly shifted identity matrix to define a parity check matrix, wherein the columns of the parity check matrix correspond to input nodes and the rows of the parity check matrix correspond to parity check sums, wherein the macro matrix is represented by an ordering of rows and columns from an arrangement of:

| 57 |    |    | 50 |    | 11 | 50 |    | 79 |
|----|----|----|----|----|----|----|----|----|
| 3  | 28 |    | 0  |    |    | 55 | 7  |    |
| 30 |    |    |    | 24 | 37 | 56 | 14 |    |

-continued

| 62 | 53 |    |    | 53 |    |    | 3  | 35 |    |    |
|----|----|----|----|----|----|----|----|----|----|----|
| 40 |    |    | 20 | 66 |    |    | 22 | 28 |    |    |
| 0  |    |    |    | 8  |    | 42 |    | 50 |    | 8  |
| 69 | 79 | 79 |    |    |    | 56 |    | 52 |    |    |
| 65 |    |    |    | 38 | 57 |    |    | 72 |    | 27 |
| 64 |    |    |    | 14 | 52 |    |    | 30 |    | 32 |
|    | 45 |    | 70 | 0  |    |    |    | 77 | 9  |    |
| 2  | 56 |    | 57 | 35 |    |    |    |    |    | 12 |
| 24 |    |    | 61 | 60 |    |    | 27 | 51 |    | 16 |

| 1 | 0 |   |   |   |   |   |   |   |   |   |   |
|---|---|---|---|---|---|---|---|---|---|---|---|
|   | 0 | 0 |   |   |   |   |   |   |   |   |   |
|   |   | 0 | 0 |   |   |   |   |   |   |   |   |
|   |   |   | 0 | 0 |   |   |   |   |   |   |   |
|   |   |   |   | 0 | 0 |   |   |   |   |   |   |
|   |   |   |   |   | 0 | 0 |   |   |   |   |   |
| 0 |   |   |   |   |   | 0 | 0 |   |   |   |   |
|   |   |   |   |   |   |   | 0 | 0 |   |   |   |
|   |   |   |   |   |   |   |   | 0 | 0 |   |   |
|   |   |   |   |   |   |   |   |   | 0 | 0 |   |
|   |   |   |   |   |   |   |   |   |   | 0 | 0 |
| 1 |   |   |   |   |   |   |   |   |   |   | 0 | in which numerical values correspond to the shifts of the identity diagonal in each of the circularly shifted identity matrices, and in which blank matrix entries correspond to a zero-valued matrix;

modulating at least one carrier signal to produce a signal stream having symbols corresponding to the codeword; and transmitting the signal stream over a communications channel.

2. The method of claim 1, further comprising:

separating the codeword into a plurality of datastreams;

wherein the modulating step comprises:

modulating at least one carrier signal to produce each of a plurality of signal streams having symbols corresponding to an associated encoded datastream;

and wherein the transmitting step comprises:

transmitting the plurality of signal streams over a communications channel.

3. The method of claim 1, wherein the modulating step modulates a plurality of subchannel carrier signals for each of the plurality of signal streams.

4. A transceiver for transmitting an encoded signal stream, comprising:

encoder circuitry, for encoding payload data according to a low density parity check (LDPC) code to the block of payload data to encode the received block of payload data into a codeword, the LDPC code represented by a macro matrix arranged in block rows and block columns and in which each entry corresponds to an 81×81 zero-valued matrix or corresponds to an 81×81 circularly shifted identity matrix to define a parity check matrix, wherein the columns of the parity check matrix correspond to input nodes and the rows of the parity check matrix correspond to parity check sums, wherein the macro matrix is represented by an ordering of rows and columns from an arrangement of:

| 57 |    |    | 50 |    | 11 | 50 |    | 79 | 1 | 0 |   |   |
|----|----|----|----|----|----|----|----|----|---|---|---|---|
| 3  | 28 |    | 0  |    |    | 55 | 7  |    |   | 0 | 0 |   |
| 30 |    |    |    | 24 | 37 | 56 | 14 |    |   |   | 0 | 0 |
| 62 | 53 |    |    | 53 |    |    | 3  | 35 |   |   |   | 0 |

-continued

```
40        20 66      22 28            0  0
 0            8    42    50     8     0  0
69 79 79           56    52        0     0  0
65            38 57      72  27             0  0
64            14 52      30        32       0  0
   45      70  0         77 9                  0  0
 2 56      57 35               12               0  0
24      61    60      27 51         16 1           0
``` in which numerical values correspond to the shifts of the identity diagonal in each of the circularly shifted identity matrices, and in which blank matrix entries correspond to a zero-valued matrix;

a modulator, for modulating at least one carrier signal to produce a signal stream having symbols corresponding to the codeword; and circuitry, for transmitting the modulated signal stream over a communications channel.

5. The transceiver of claim 4, further comprising:

parser circuitry for separating the encoded codeword into a plurality of datastreams; and a plurality, of antennae;

wherein the modulator modulates at least one carrier signal according to each of the plurality of datastreams;

and wherein the transmitting circuitry comprises:

RF circuitry, for transmitting, modulated signals for each of the multiple datastreams over a corresponding one of the plurality of antennae, the modulated signals corresponding to codewords for the respective datastreams generated by the encoder circuitry.

6. The transceiver of claim 5, wherein the modulator comprises:

modulation circuitry, for modulating a plurality of sub-channel carriers for each of the multiple datastreams according to the codewords.

7. A method of decoding coded communications, comprising the steps of:

demodulating a received signal; to produce a datastream;

decoding the datastream with an error correcting code by applying the error correcting code to sequences of codewords in the datastream wherein the error correcting code is a low density parity check (LDPC) represented by a macro matrix arranged in block rows and block columns and in which each entry corresponds to an 81×81 zero-valued matrix or corresponds to an 81×81 circularly shifted identity matrix to define a parity check matrix, wherein the columns of the parity check matrix correspond to input nodes and the rows of the parity check matrix correspond to parity check sums, wherein the macro matrix is represented by an ordering of rows and columns from an arrangement of:

```
57            50    11    50    79     1  0
 3   28        0          55  7         0  0
30            24 37       56 14            0  0
62 53         53        3 35                  0  0
40        20 66      22 28                       0  0
 0            8    42    50     8                   0  0
69 79 79           56    52        0                   0  0
65            38 57      72  27                            0  0
64            14 52      30        32                         0  0
   45      70  0         77 9                                    0  0
 2 56      57 35               12                                   0  0
24      61    60      27 51         16 1                               0
``` in which numerical values correspond to the shifts of the identity diagonal in each of the circularly shifted identity matrices, and in which blank matrix entries correspond to a zero-valued matrix; and forwarding the decoded datastream to a destination.

8. The method of claim 7, wherein the signal is received at each of a plurality of antennae;

wherein the demodulating, step comprises:

demodulating a signal received at each of a plurality, of antennae; to produce a plurality of demodulated datastreams;

and further comprising after the demodulating step:

combining the plurality of demodulated datastreams into a datastream, arranged as a sequence of codewords, each codeword including information and parity portions.

9. A transceiver for receiving and decoding an encoded signal stream, comprising:

a demodulator, for demodulating at least one carrier signal to produce a signal stream having symbols corresponding to codewords; and decoder circuitry, for decoding payload data from the codewords according to a low density parity check (LDPC) code, the LDPC code represented by a macro matrix arranged in block rows and block columns and in which each entry corresponds to either an 81×81 zero-valued matrix or corresponds to an 81×81 circularly shifted identity matrix to define a parity check matrix, wherein the columns of the parity check matrix correspond to input nodes and the rows of the parity check matrix correspond to parity check sums, wherein the macro matrix is represented by an ordering of rows and columns from an arrangement of:

```
57       50    11    50    79    1  0
 3    28  0          55  7         0  0
30        24 37      56 14           0  0
62 53     53       3 35                0  0
40     20 66      22 28                  0  0
 0         8    42    50       8           0  0
69 79 79        56    52          0          0  0
65        38 57       72    27                  0  0
64        14 52       30       32                 0  0
   45     70  0       77  9                         0  0
 2 56     57 35             12                        0  0
24    61  60          27 51       16  1                 0
``` in which numerical values correspond to the shifts of the identity diagonal in each of the circularly shifted identity matrices, and in which blank matrix entries correspond to a zero-valued matrix.

10. The transceiver of claim 9, further comprising:

interface circuitry, coupled to a plurality of antennae to receive signals from each of the antennae;

wherein the demodulator comprises:

demodulating circuitry for demodulating a signal received from each of the plurality of antennae; to produce a plurality of demodulated datastreams;

and further comprising;

circuitry, coupled to the demodulating circuitry, for combining the plurality of demodulated datastreams into the datastream applied to the decoder circuitry, the datastream arranged as a sequence of codewords, each codeword including information and parity portions.

\* \* \* \* \*

UNITED STATES PATENT AND TRADEMARK OFFICE
CERTIFICATE OF CORRECTION

| | | |
|---|---|---|
| PATENT NO. | : 7,668,248 B2 | Page 1 of 1 |
| APPLICATION NO. | : 11/550662 | |
| DATED | : February 23, 2010 | |
| INVENTOR(S) | : Dale E. Hocevar | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 747 days.

Signed and Sealed this

Twenty-eighth Day of December, 2010

David J. Kappos
*Director of the United States Patent and Trademark Office*